United States Patent
Cheng et al.

(10) Patent No.: US 9,093,534 B2
(45) Date of Patent: Jul. 28, 2015

(54) DIELECTRIC FILLER FINS FOR PLANAR TOPOGRAPHY IN GATE LEVEL

(71) Applicant: International Business Machines Corporation, Armonk, NY (US)

(72) Inventors: Kangguo Cheng, Schenectady, NY (US); Ramachandra Divakaruni, Ossining, NY (US); Bruce B. Doris, Slinerlands, NY (US); Ali Khakifirooz, Mountain View, CA (US); Edward J. Nowak, Essex Junction, VT (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/953,024

(22) Filed: Jul. 29, 2013

(65) Prior Publication Data

US 2015/0028398 A1     Jan. 29, 2015

(51) Int. Cl.
*H01L 29/78*     (2006.01)
*H01L 29/66*     (2006.01)

(52) U.S. Cl.
CPC ........ *H01L 29/785* (2013.01); *H01L 29/66795* (2013.01)

(58) Field of Classification Search
CPC .................................................... H01L 29/785
See application file for complete search history.

(56) References Cited

U.S. PATENT DOCUMENTS

| | | | |
|---|---|---|---|
| 7,229,880 B2 | 6/2007 | Dong et al. | |
| 7,871,873 B2 * | 1/2011 | Maszara et al. | 438/164 |
| 8,334,572 B2 | 12/2012 | Chung et al. | |
| 2007/0120156 A1 * | 5/2007 | Liu et al. | 257/288 |
| 2007/0267695 A1 * | 11/2007 | Lee | 257/347 |
| 2009/0278196 A1 * | 11/2009 | Chang et al. | 257/328 |
| 2010/0144121 A1 * | 6/2010 | Chang et al. | 438/478 |
| 2010/0163971 A1 * | 7/2010 | Hung et al. | 257/327 |
| 2012/0313170 A1 | 12/2012 | Chang et al. | |

* cited by examiner

*Primary Examiner* — Lex Malsawma
(74) *Attorney, Agent, or Firm* — Scully, Scott, Murphy & Presser, P.C.; H. Daniel Schnurmann

(57) ABSTRACT

An array of stacks containing a semiconductor fins and an oxygen-impermeable cap is formed on a semiconductor substrate with a substantially uniform areal density. Oxygen-impermeable spacers are formed around each stack, and the semiconductor substrate is etched to vertically extend trenches. Semiconductor sidewalls are physically exposed from underneath the oxygen-impermeable spacers. The oxygen-impermeable spacers are removed in regions in which semiconductor fins are not needed. A dielectric oxide material is deposited to fill the trenches. Oxidation is performed to convert a top portion of the semiconductor substrate and semiconductor fins not protected by oxygen-impermeable spacers into dielectric material portions. Upon removal of the oxygen-impermeable caps and remaining oxygen-impermeable spacers, an array including semiconductor fins and dielectric fins is provided. The dielectric fins alleviate variations in the local density of protruding structures, thereby reducing topographical variations in the height of gate level structures to be subsequently formed.

20 Claims, 21 Drawing Sheets

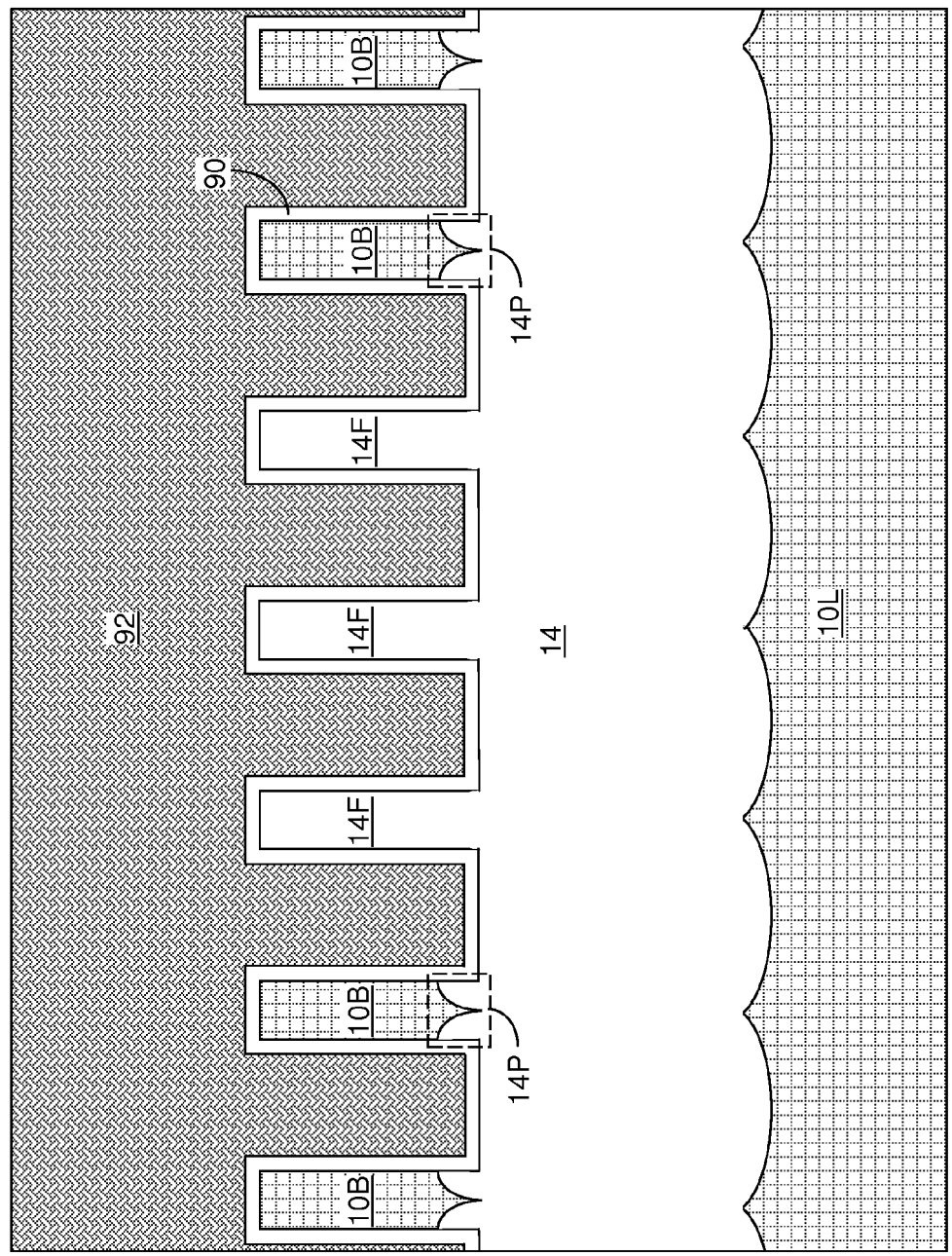

DIELECTRIC FILLER FINS FOR PLANAR TOPOGRAPHY IN GATE LEVEL

BACKGROUND

The present disclosure relates to a semiconductor structure, and particularly to a semiconductor structure including semiconductor fins and dielectric filler fins located on a dielectric material layer, and a method for manufacturing the same.

A finFET is field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

Semiconductor fins are not necessarily formed with uniform areal density. Local variations in the density of the semiconductor fins lead to variations in the height of gate structures formed over the semiconductor fins. For example, the height of gate structures formed in regions with a low density of semiconductor fins is less than the height of gate structures formed in regions with a high density of semiconductor fins. Such a difference induces topographical variations in the height of the top surface of a gate level dielectric material layer and subsequently formed metal interconnect structures. Thus, there exists a need for reducing topographical variations in the height of gate level structures.

SUMMARY

An array of stacks containing a semiconductor fin and an oxygen-impermeable cap is formed on a semiconductor substrate with a substantially uniform areal density. Oxygen-impermeable spacers are formed around each stack, and the semiconductor substrate is etched to vertically extend trenches. Semiconductor sidewalls are physically exposed from underneath the oxygen-impermeable spacers. The oxygen-impermeable spacers are removed in regions in which semiconductor fins are not needed. A dielectric oxide material is deposited to fill the trenches. Oxidation is performed to convert a top portion of the semiconductor substrate and semiconductor fins not protected by the oxygen-impermeable spacers into dielectric material portions. Upon removal of the oxygen-impermeable caps and remaining oxygen-impermeable spacers, an array including semiconductor fins and dielectric fins is provided. The dielectric fins alleviate variations in the local density of protruding structures, thereby reducing topographical variations in the height of gate level structures to be subsequently formed.

According to an aspect of the present disclosure, a semiconductor structure is provided. The semiconductor structure includes a semiconductor oxide layer located on a semiconductor material layer. A semiconductor oxide fin protrudes above a planar surface of the semiconductor oxide layer. A semiconductor oxide pedestal protrudes above the planar surface of the semiconductor oxide layer and is laterally spaced from the semiconductor oxide fin. The semiconductor structure further includes a semiconductor fin contacting, and located above, the semiconductor oxide pedestal. A topmost surface of the semiconductor oxide fin is located above a topmost portion of the semiconductor oxide pedestal.

According to another aspect of the present disclosure, a method of forming a semiconductor structure is provided. A first protruding structure and a second protruding structure are formed over a semiconductor material layer. The first and second protruding structures are laterally surrounded by a cavity. The first protruding structure includes a first semiconductor pedestal of integral construction with the semiconductor material layer, and the second protruding structure includes a second semiconductor pedestal of integral construction with the semiconductor material layer. An entirety of the second semiconductor pedestal is converted into a semiconductor oxide material. A lower portion of the first semiconductor pedestal is converted into a semiconductor oxide pedestal by oxidation while preventing an upper portion of the first semiconductor pedestal from converting into any other material different from a material of the first semiconductor pedestal prior to the oxidation. The semiconductor oxide material can be patterned into a semiconductor oxide fin.

BRIEF DESCRIPTION OF THE SEVERAL VIEWS OF THE DRAWINGS

FIG. 11 is a vertical cross-sectional view of a variation of the first exemplary semiconductor structure after formation of a replacement gate dielectric and a replacement gate electrode according to the first embodiment of the present disclosure.

DETAILED DESCRIPTION

Figure 1:
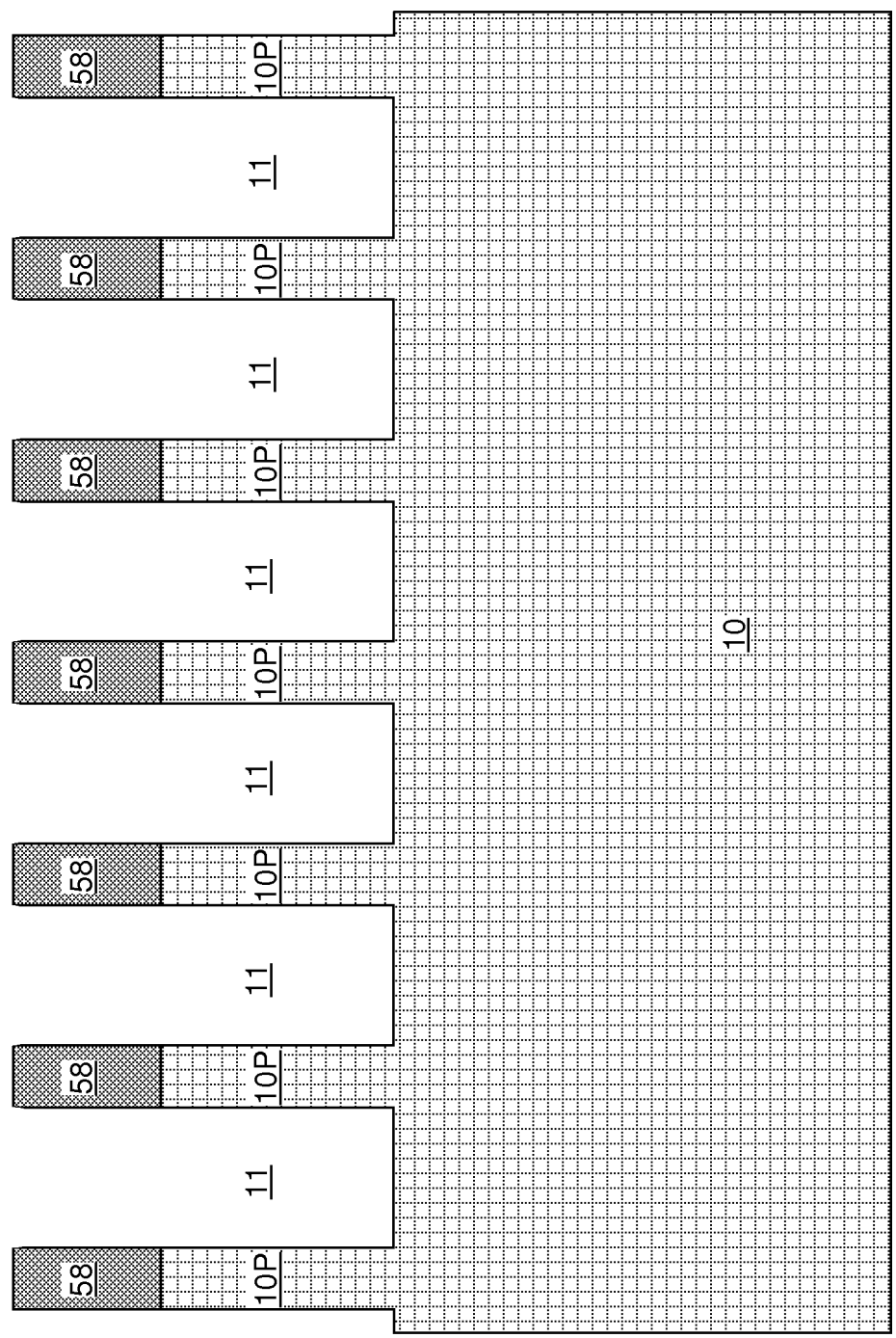
FIG. 1 is a vertical cross-sectional view of a first exemplary semiconductor structure after formation of oxygen-impermeable caps and a trench laterally surrounding semiconductor pedestals according to an embodiment of the present disclosure.

As stated above, the present disclosure relates to a semiconductor structure including semiconductor fins and dielectric filler fins located on a dielectric material layer, and a method for manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Figure 1A:
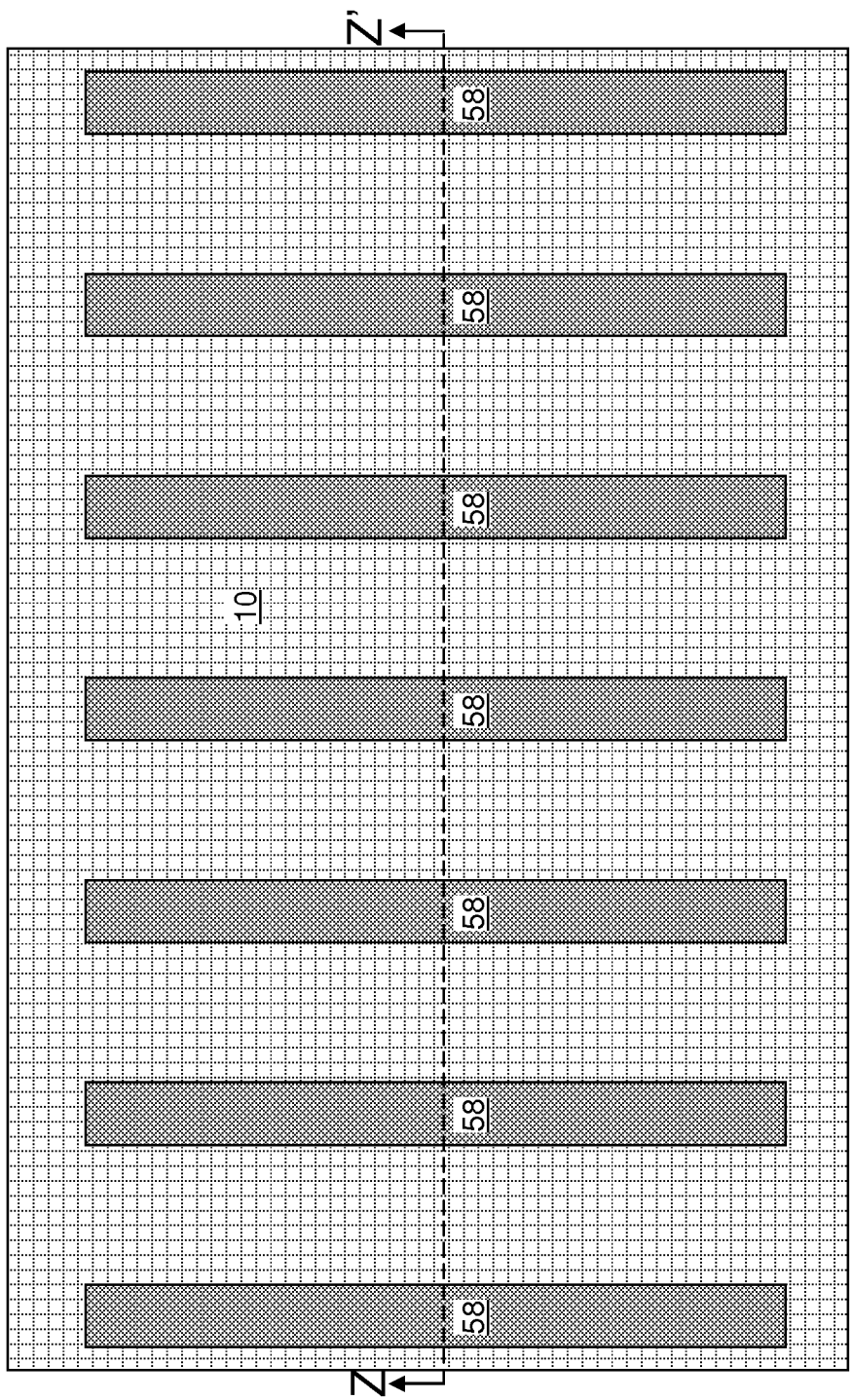
FIG. 1A is a top-down view of the first exemplary semiconductor structure of FIG. 1. The vertical plane Z-Z' represents the plane of the vertical cross-sectional view of FIG. 1.

Referring to FIGS. 1 and 1A, a first exemplary semiconductor structure according to an embodiment of the present disclosure contains a semiconductor substrate 10 including a plurality of semiconductor pedestals 10P, and a plurality of oxygen-impermeable caps 58. As used herein, a "pedestal" refers to a structure that protrudes from a planar surface of an underlying structure having a same material composition. As used herein, an "oxygen-impermeable" element refers to an element composed of a material having an oxygen diffusion rate that does not exceed 1/10 of the oxygen diffusion rate of a silicon nitride material formed by low pressure chemical vapor deposition (LPCVD) within a temperature range between 600 degrees Celsius and 1,000 degrees Celsius. A trench 11 laterally surrounds the plurality of semiconductor pedestals 10P and the plurality of oxygen-impermeable caps 58.

The first exemplary semiconductor structure illustrated in FIGS. 1 and 1A can be formed, for example, by providing a semiconductor substrate including a semiconductor material and a planar top surface, depositing an oxygen-impermeable material layer on the planar top surface of the semiconductor substrate, patterning the oxygen-impermeable material layer into the plurality of oxygen-impermeable caps 58, and vertically recessing physically exposed planar surfaces of the semiconductor substrate by an anisotropic etch. The oxygen-impermeable material layer can be deposited, for example, by chemical vapor deposition (CVD). The patterning of the oxygen-impermeable material layer can be performed, for example, by application and patterning of a photoresist layer, and transfer of the pattern in the photoresist layer into the oxygen-impermeable material layer to form the oxygen-impermeable caps 58. The thickness of the oxygen-impermeable material layer and the oxygen-impermeable caps 58 can be in a range from 30 nm to 300 nm, although lesser and greater thicknesses can also be employed.

In one embodiment, the oxygen-impermeable caps 58 can include a dielectric nitride material such as silicon nitride. The semiconductor material of the semiconductor substrate can be an elemental semiconductor material such as silicon or germanium, an alloy of at least two elemental semiconductor materials, a III-V compound semiconductor material, a II-VI compound semiconductor material, an organic semiconductor material, or a combination thereof. In one embodiment, the semiconductor material of the semiconductor substrate can be silicon or a silicon-germanium alloy.

The recessing of the physically exposed top surface of the semiconductor substrate forms a trench 11, which can laterally surround the plurality of oxygen-impermeable caps 58 and the portions of the semiconductor substrate located above the horizontal plane including the recessed planar surface of the semiconductor substrate. The semiconductor substrate 10 includes a semiconductor material layer 10L, which is a planar semiconductor portion located at, or below, the recessed planar surface and further includes the plurality of semiconductor pedestals 10P. The height of the plurality of semiconductor pedestals 10P can be in a range from 30 nm to 600 nm, although lesser and greater heights can also be employed.

In one embodiment, the oxygen-impermeable caps 58 can have rectangular horizontal cross-sectional areas. The horizontal direction along which longer sides of each rectangle extend is herein referred to as a lengthwise direction of the corresponding oxygen-impermeable cap 58. The horizontal direction that is perpendicular to the lengthwise direction of an oxygen-impermeable cap 58 is herein referred to as a widthwise direction of the corresponding oxygen-impermeable cap 58. In one embodiment, the oxygen-impermeable caps 58 can be arranged as a linear array in which oxygen-impermeable caps 58 having a same rectangular cross-sectional area are periodically placed along a common widthwise direction of the oxygen-impermeable caps 58. In one embodiment, the shapes of each overlying oxygen-impermeable cap 58 can be replicated in an underlying semiconductor pedestal 10P, which is formed by transfer of the pattern of the overlying oxygen-impermeable cap 58 into the semiconductor substrate by an anisotropic etch.

Each vertical stack of a semiconductor pedestal 10P and an oxygen-impermeable cap 58 constitutes a protruding structure, which protrudes from the bottom surface of the trench 11. The bottom surface of the trench 11 is a top surface of the semiconductor material layer 10L of the semiconductor substrate 10, i.e., the portion of the semiconductor substrate 10 located at, or below, the bottom surface of the trench 11.

Figure 2:
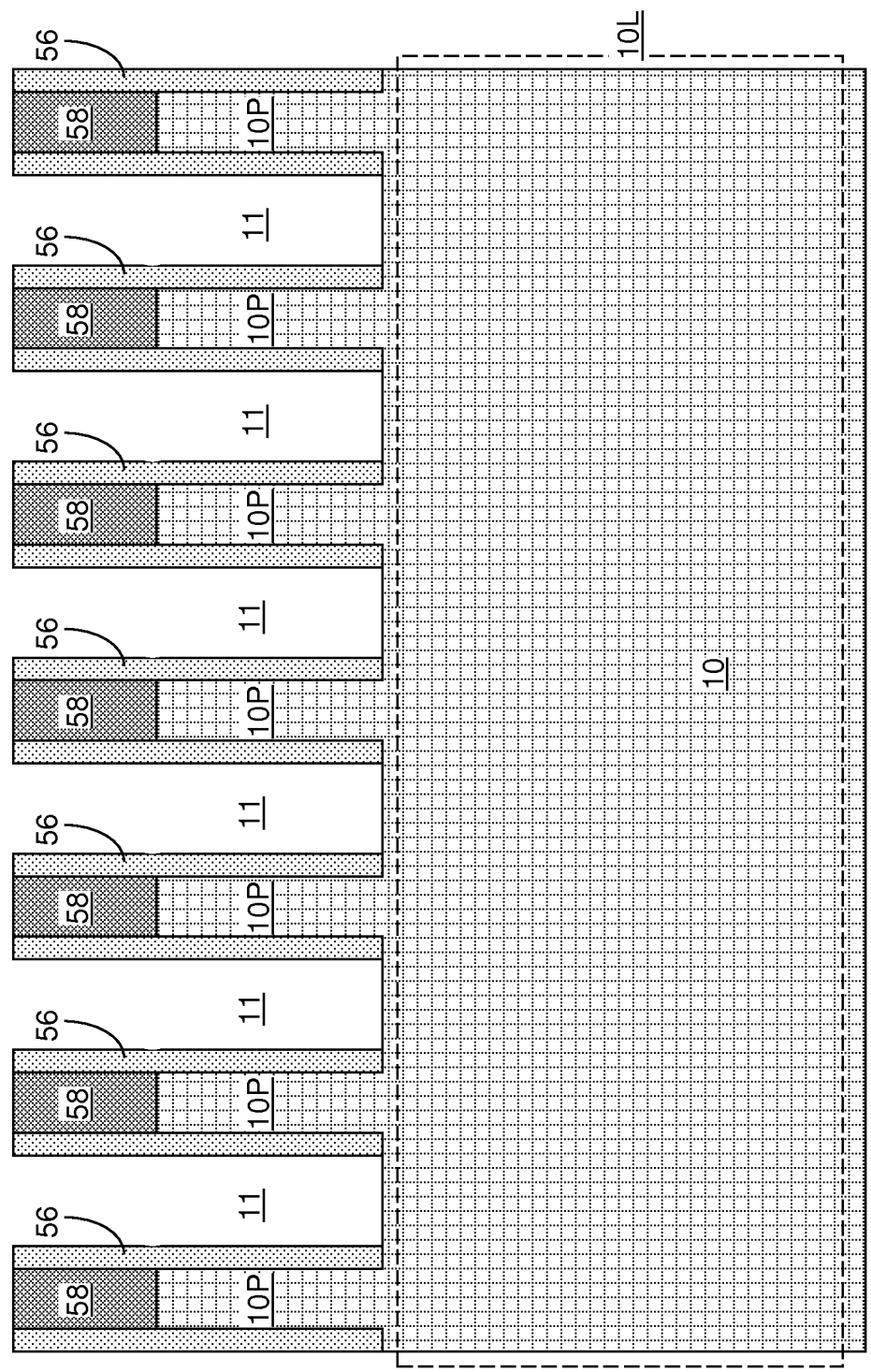
FIG. 2 is a vertical cross-sectional view of the first exemplary semiconductor structure after formation of oxygen-impermeable spacers according to the first embodiment of the present disclosure.

Referring to FIG. 2, oxygen-impermeable spacers 56 are formed on the sidewalls of the semiconductor pedestals 10P and the oxygen-impermeable caps 58. Each oxygen-impermeable spacer 56 is formed on sidewalls of a semiconductor pedestal 10P. The oxygen-impermeable spacer 56 can be formed, for example, by depositing a conformal oxygen-impermeable material layer, for example, by chemical vapor deposition or by atomic layer deposition (ALD), and anisotropically etching horizontal portions of the conformal oxygen-impermeable material layer by an anisotropic etch. The anisotropic etch may be selective, or non-selective to the semiconductor material of the semiconductor substrate 10.

The thickness of the oxygen-impermeable spacers 56 is less than one half of the minimum spacing between a neighboring pair of semiconductor pedestals 10P. The oxygen-impermeable spacers 56 can include a dielectric material such as silicon nitride.

Figure 3:
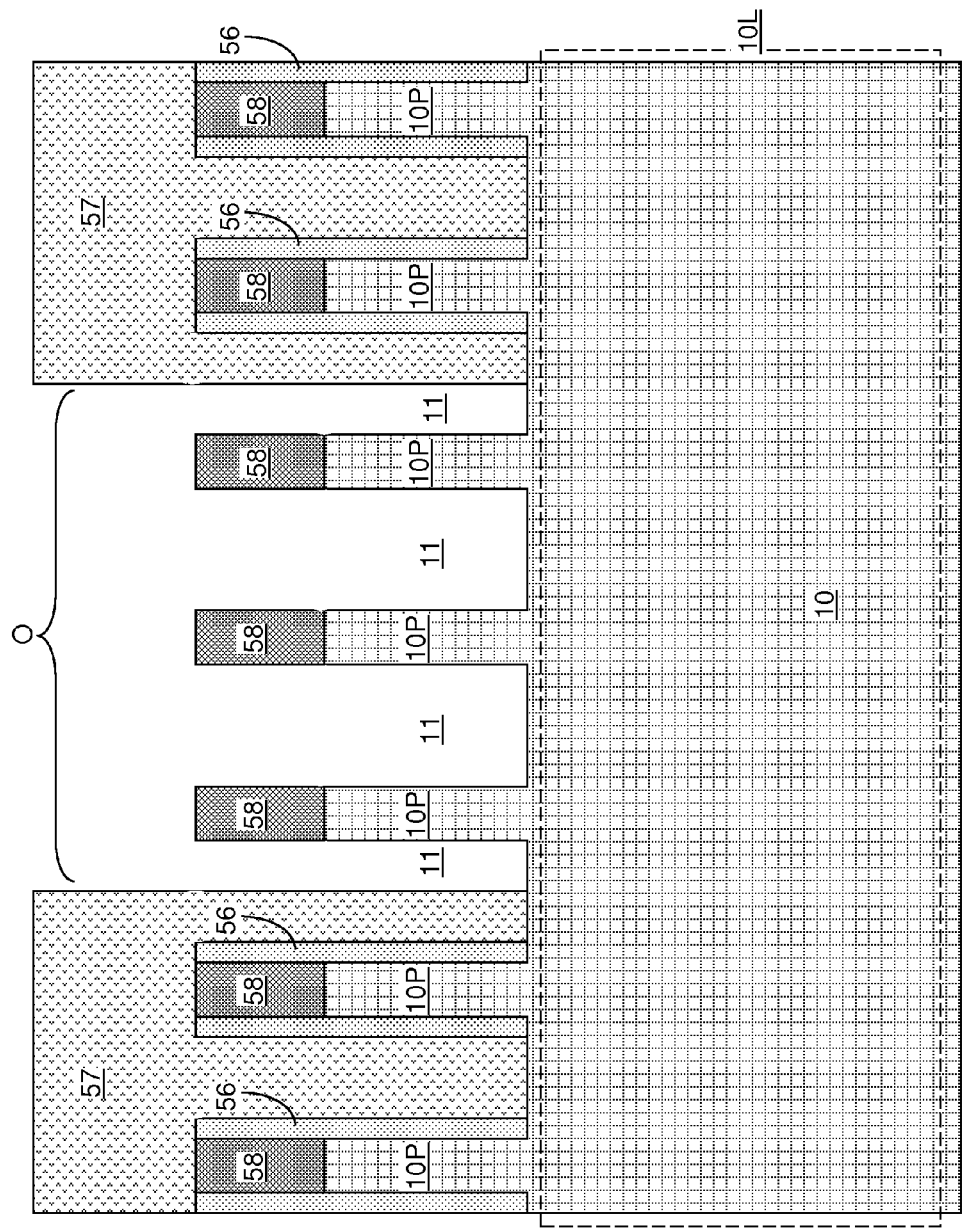
FIG. 3 is a vertical cross-sectional view of the first exemplary semiconductor structure after application and patterning of a masking layer and removal of physically exposed oxygen-impermeable spacers according to the first embodiment of the present disclosure.

Referring to FIG. 3, a masking layer 57 is applied over the vertical stacks of the semiconductor pedestals 10P and the oxygen-impermeable caps 58, and is patterned to form at least one opening O therein. In one embodiment, the masking layer 57 can be a photoresist layer that can be patterned lithographically. The edges of the patterned masking layer 57 can be located between neighboring pairs of oxygen-impermeable spacers 56, each laterally surrounding a vertical stack of a semiconductor pedestal 10P and an oxygen-impermeable cap 58. In other words, the edges of the patterned masking layer 57 can contact the planar bottom surface of the trench 11.

The oxygen-impermeable spacers 56 located underneath the masking layer 57 are herein referred to as first oxygen-impermeable spacers. The oxygen-impermeable spacers 56 located within the at least one opening O are herein referred to as second oxygen-impermeable spacers 56. The semiconductor pedestals 10P located underneath the masking layer 57 are herein referred to as first semiconductor pedestals 10P. The semiconductor pedestals 10P located within the area of the at least one opening O are herein referred to as second semiconductor pedestals. The oxygen-impermeable spacers 56 located underneath the masking layer 57 are herein referred to as first oxygen-impermeable spacers. The oxygen-impermeable spacers 56 located within the at least one opening O are herein referred to as second oxygen-impermeable spacers.

Physically exposed oxygen-impermeable spacers 56, i.e., the second oxygen-impermeable spacers, within the at least one opening O are removed selective to the semiconductor material of the semiconductor pedestals 10P while the first oxygen-impermeable spacers remain on the first semiconductor pedestal. The masking layer 57 can be subsequently removed, for example, by ashing. The second oxygen-impermeable spacers are removed while the first oxygen-impermeable spacers remain on the first semiconductor pedestals.

Figure 4:
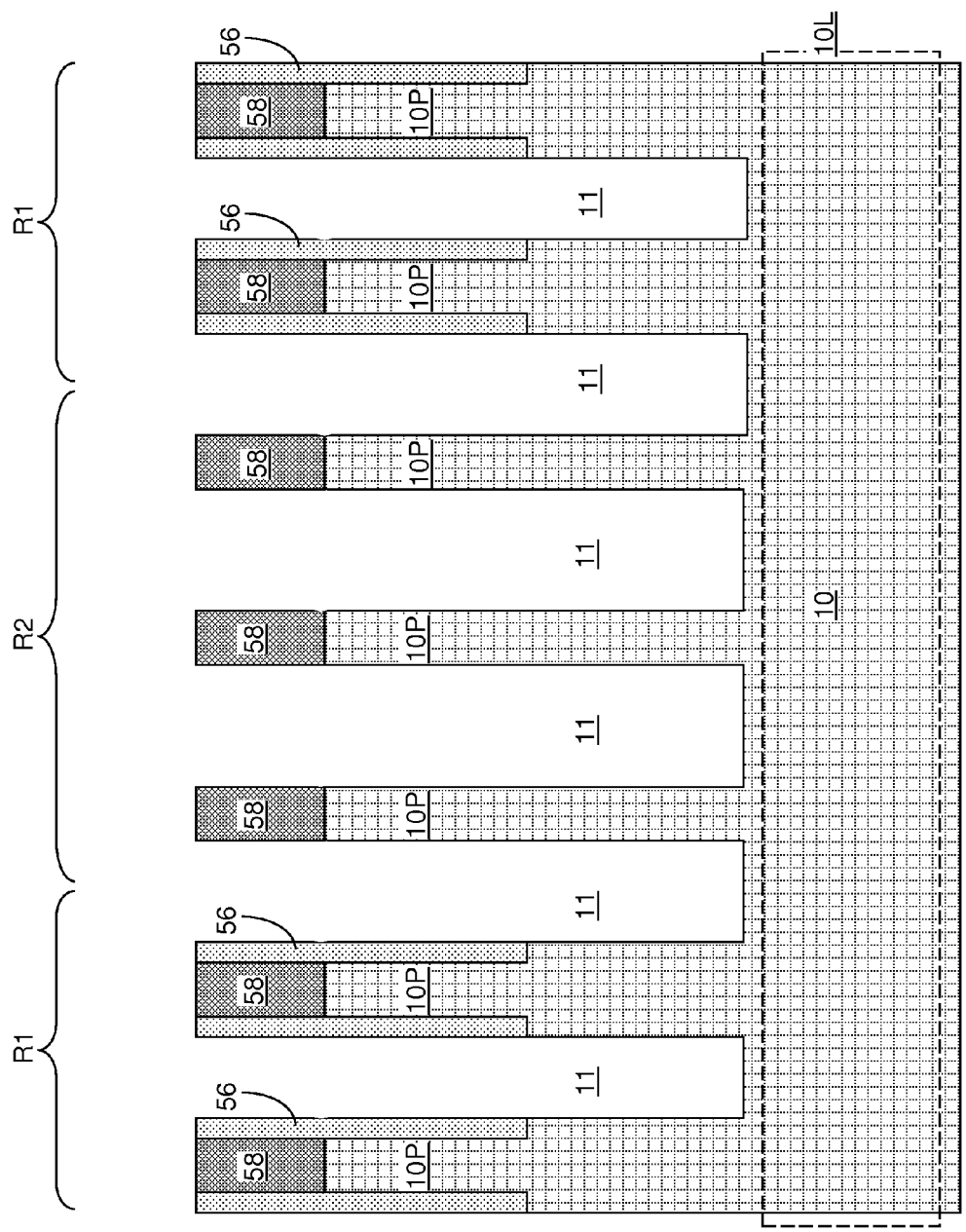
FIG. 4 is a vertical cross-sectional view of the first exemplary semiconductor structure after recessing physically exposed surfaces of a semiconductor material layer according to the first embodiment of the present disclosure.

Referring to FIG. 4, physically exposed surfaces of the semiconductor material layer 10L are recessed by an anisotropic etch, i.e., the bottom surface of the cavity 11 is recessed by the anisotropic etch. The anisotropic etch employs the combination of the oxygen-impermeable caps 58 and the oxygen-impermeable spacers 56 as an etch mask. Each semiconductor pedestals 10P is vertically extended by the anisotropic etch as the trench 11 is extended downward by the anisotropic etch. Thus, the height of each of the first semiconductor pedestals and the height of the second semiconductor pedestal increase by the recessing. The increase in the height can, for example, in a range from 10 nm to 1,000 nm, although lesser and greater height increases can also be employed.

Each first semiconductor pedestal 10P includes a lower portion having sidewalls that are vertically coincident with outer sidewalls of the oxygen-impermeable spacer 56 and an upper portion that contacts inner sidewalls of the oxygen-impermeable spacer 56. Each second semiconductor pedestal 10P includes vertical sidewalls that extend between the bottom surface of the second oxygen-impermeable cap 58 and a top surface of the semiconductor material layer 10L of the semiconductor substrate 10. As used herein, a first surface is vertically coincident with a second surface if there exists a vertical plane that includes the first surface and the second surface.

Two types of protruding structures are formed above the semiconductor material layer 10L of the semiconductor substrate 10. First protruding structures are formed in a first region R1, which is the region in which the masking layer 57 is present at the processing step of FIG. 3. Each first protruding structure includes a first semiconductor pedestal 10P, a first oxygen-impermeable cap 58, and a first oxygen-impermeable spacer 56. Second protruding structures are formed in a second region R2, which is the region in which the at least one opening O is present at the processing step of FIG. 3. Each second protruding structure includes a second semiconductor pedestal 10P and a second oxygen-impermeable cap 58. The first and second protruding structures (10P, 58, 56) are laterally surrounded by the cavity 11.

Each first protruding structure in the first region R1 includes a first semiconductor pedestal 10A of integral construction with the semiconductor material layer 10L. As used herein, a first element is "of integral construction with" a second element if the first and second elements are composed of a same material and are contiguous throughout the entirety thereof. Each second protruding structure in the second region R2 includes a second semiconductor pedestal 10A of integral construction with the semiconductor material layer 10L.

Figure 5:
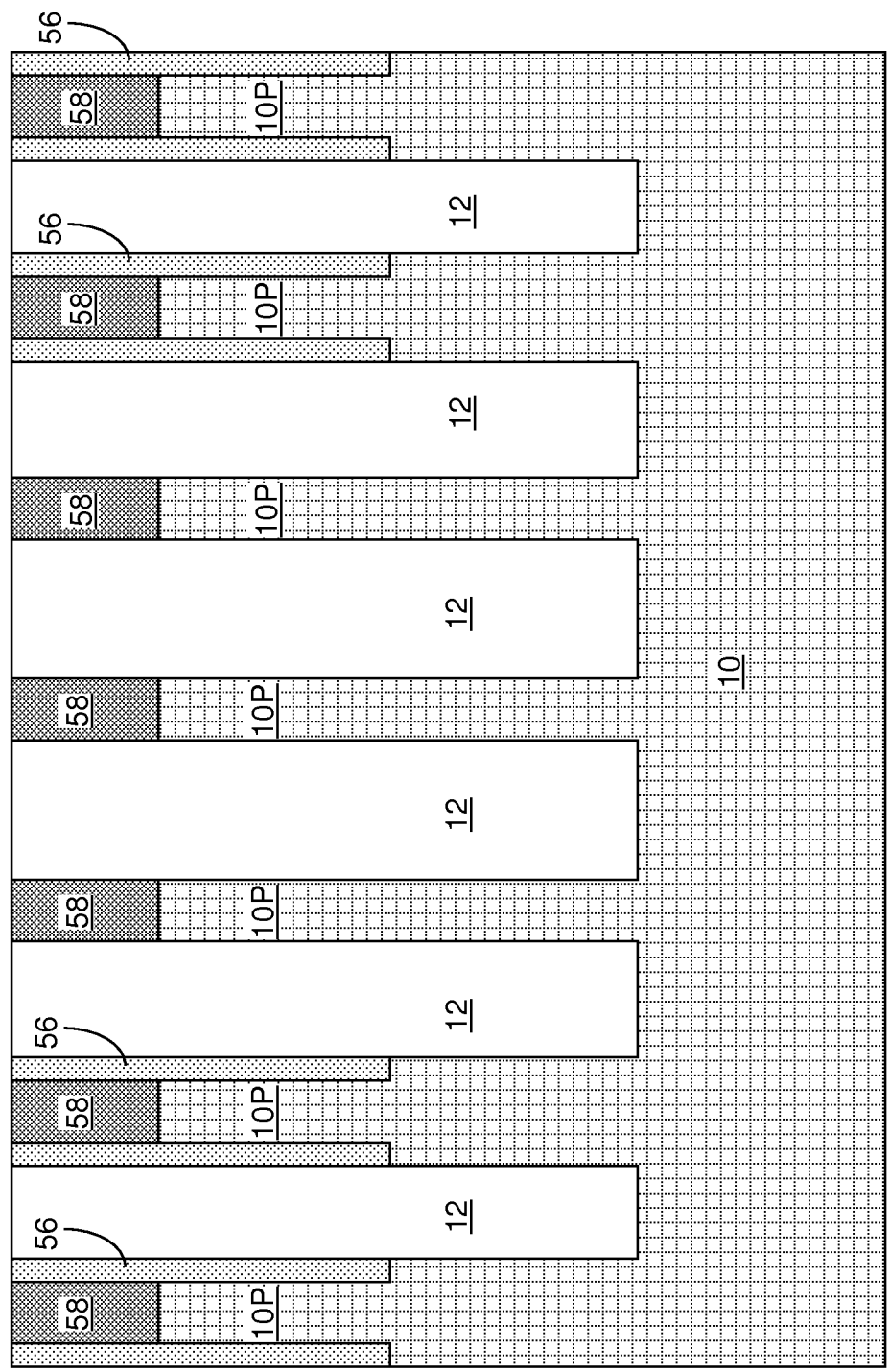
FIG. 5 is a vertical cross-sectional view of the first exemplary semiconductor structure after filling the trench with an oxygen-permeable material according to the first embodiment of the present disclosure.

Referring to FIG. 5, the trench 11 is filled with an oxygen-permeable material to form an oxygen-permeable portion 12. As used herein, a material is "oxygen-permeable" if the material has an oxygen diffusion rate that is at least ½ of the oxygen diffusion rate of a thermal silicon oxide material formed thermal oxidation of silicon as measured within a temperature range between 600 degrees Celsius and 1,000 degrees Celsius. In one embodiment, the oxygen-permeable material can be silicon oxide deposited by chemical vapor deposition. The deposited oxygen-permeable material is planarized, for example, by chemical mechanical planarization employing top surfaces of the oxygen-impermeable caps 58. The top surface of the oxygen-permeable portion 12 can be coplanar with the top surfaces of the oxygen-impermeable caps 58.

Figure 6:
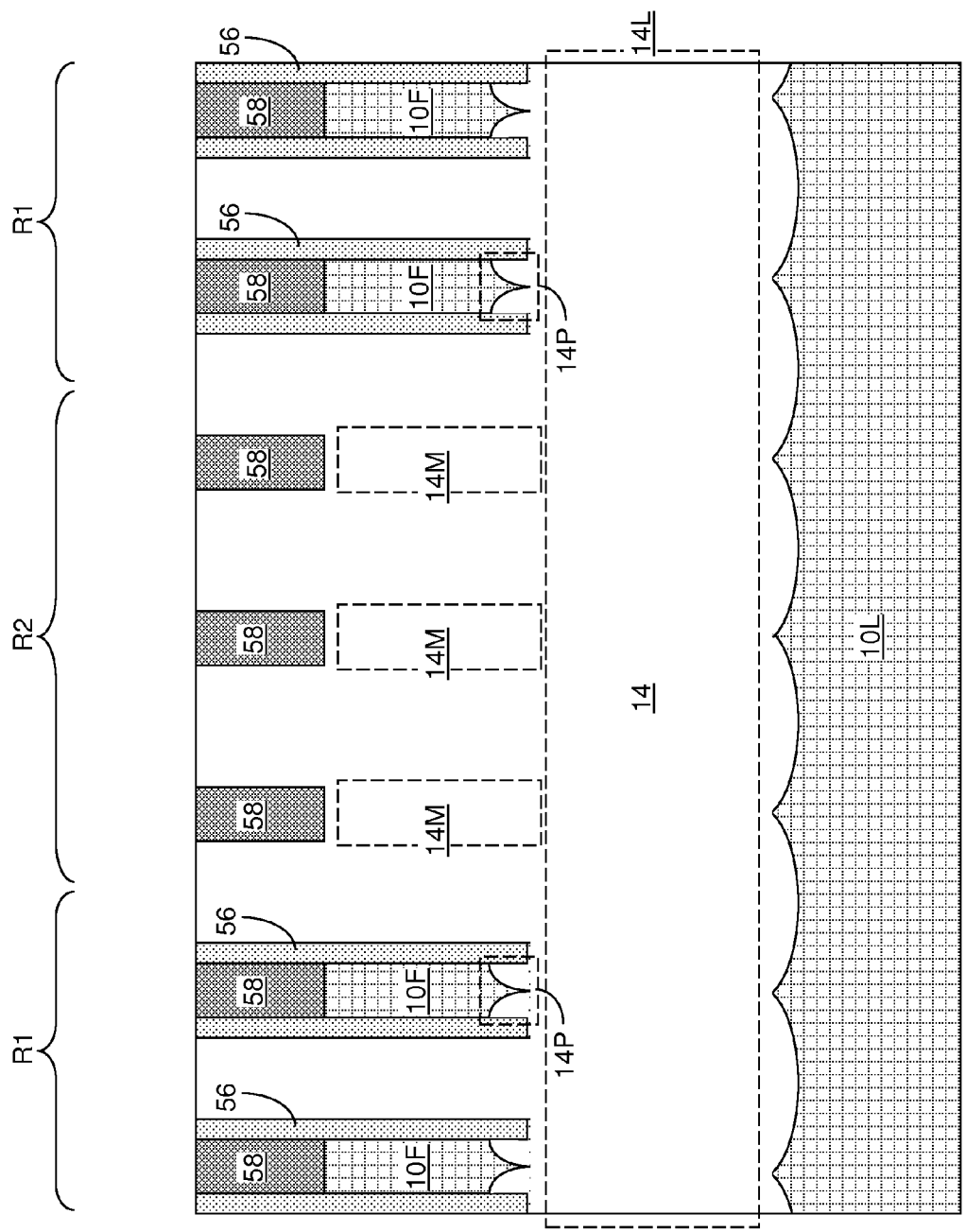
FIG. 6 is a vertical cross-sectional view of the first exemplary semiconductor structure after oxidation of portions of the semiconductor material layer and semiconductor pedestals that are proximal to the deposited oxygen-permeable material according to the first embodiment of the present disclosure.

Referring to FIG. 6, thermal oxidation process is performed to oxidize portions of the semiconductor material layer 10L and semiconductor pedestals 10P that are proximal to the deposited oxygen-permeable material of the oxygen-permeable portion 12. The processing conditions and the duration of the thermal oxidation process can be selected such that entirety of the second semiconductor pedestals 10P in the second region R2 into semiconductor oxide material portions 14M, and a lower portion of each first semiconductor pedestal into semiconductor oxide pedestals 14P by oxidation, while preventing an upper portion of the first semiconductor pedestals 10P in the first region R1 from converting into any other material different from the material of the first semiconductor pedestal 10P prior to the oxidation. Each remaining upper portion of first semiconductor pedestals 10P is a semiconductor fin 10F. As used herein, a semiconductor fin refers to a semiconductor material portion having a pair of parallel vertical sidewalls.

An upper portion of the semiconductor material layer 10L underlying the first and second semiconductor pedestals 10P is converted into a semiconductor oxide layer 14L that is of integral construction with the semiconductor oxide material portions 14M and the semiconductor oxide pedestals 14P. The entirety of the second semiconductor pedestals and the lower portions of the first semiconductor pedestals are converted into the semiconductor oxide material portions 14M and the semiconductor oxide pedestals 14P. The semiconductor oxide material portions 14M and the semiconductor oxide pedestal portions 14P include a semiconductor oxide material, i.e., an oxide of a semiconductor material. The semiconductor oxide material portions 14M and the semiconductor oxide pedestal portions 14P can include an identical semiconductor oxide material. For example, the semiconductor oxide material portions 14M and the semiconductor oxide pedestal portions 14P can include silicon oxide if the semiconductor substrate 10 is a silicon substrate. The semiconductor oxide layer 14L, the semiconductor oxide material portions 14M, the semiconductor oxide pedestal portions 14P, and any other remaining portion of the oxygen-permeable portion 12 are collectively referred to as an oxygen-permeable structure 14'.

Figure 7:
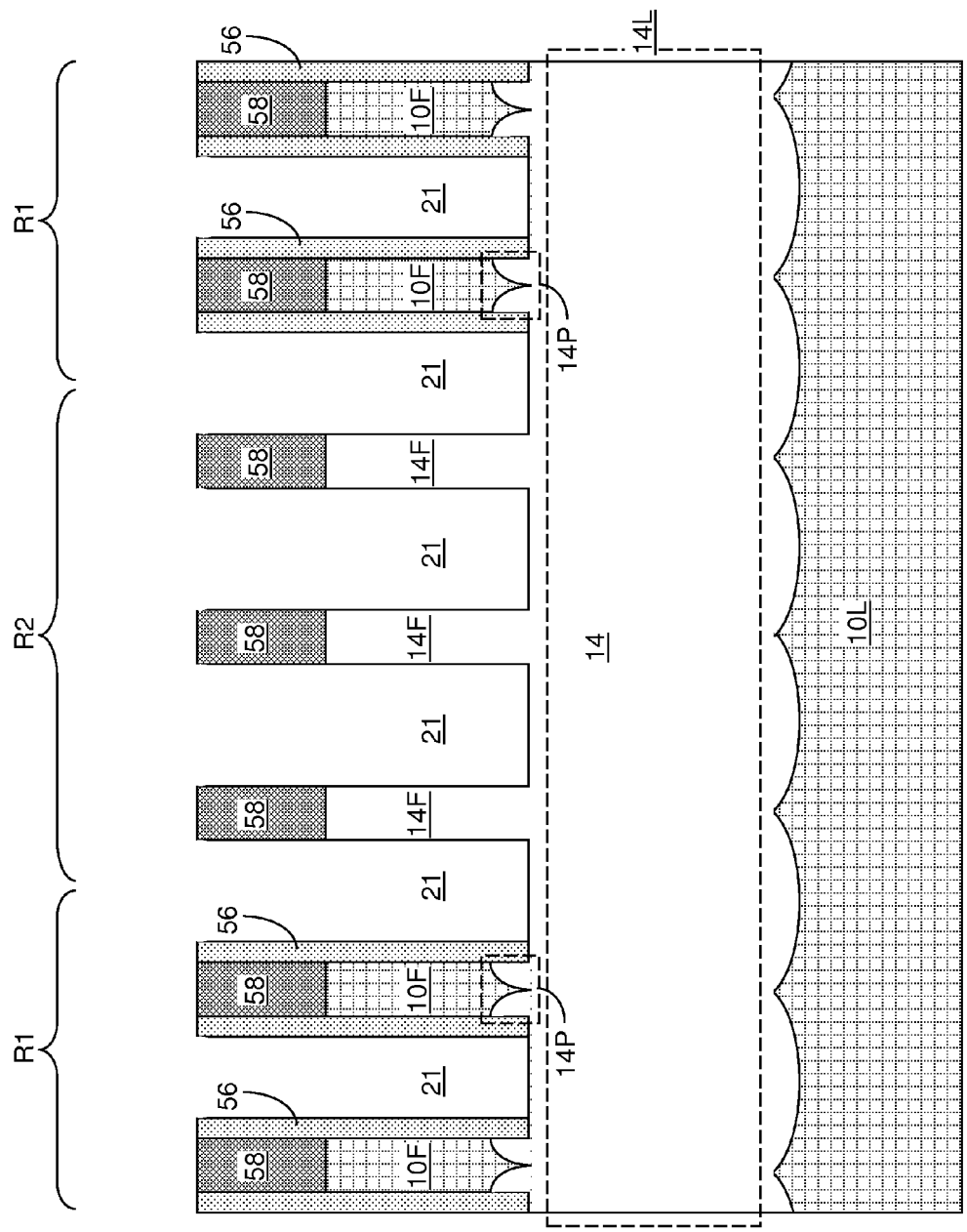
FIG. 7 is a vertical cross-sectional view of the first exemplary semiconductor structure after recessing the deposited oxygen-permeable material according to the first embodiment of the present disclosure.

Referring to FIG. 7, the oxygen-permeable structure 14 is patterned by an anisotropic etch. Specifically, the deposited oxygen-permeable material is recessed by an anisotropic etch. The pattern defined by the combination of the oxygen-impermeable caps 58 and the oxygen-impermeable spacers 56 is transferred into the oxygen-permeable structure 14 by an anisotropic etch that etches the material of the oxygen-permeable structure 14 selective to the materials of the oxygen-impermeable caps 58 and the oxygen-impermeable spacers 56. Each remaining portion of the semiconductor oxide material portions 14M underlying an oxygen-impermeable cap 58 and overlying the semiconductor oxide layer 14L is a semiconductor oxide fin. As used herein, a semiconductor fin refers to a semiconductor oxide material portion having a pair of parallel vertical sidewalls. A trench 21 is formed such that the trench 21 laterally surrounds first protruding structures in the first region R1 and second protruding structures in the second region R2.

Each first protruding structure in the first region R1 includes a semiconductor oxide pedestal portion 14P, a semiconductor fin 10F, an oxygen-impermeable cap 58, and an oxygen-impermeable spacer 56. Each second protruding structure in the second region R2 includes a vertical stack of a semiconductor oxide fin 14F and an oxygen-impermeable cap 58. The horizontal cross-sectional area of each semiconductor oxide fin 14F can be the same as the horizontal cross-sectional area of an overlying oxygen-impermeable cap 58.

Figure 8:
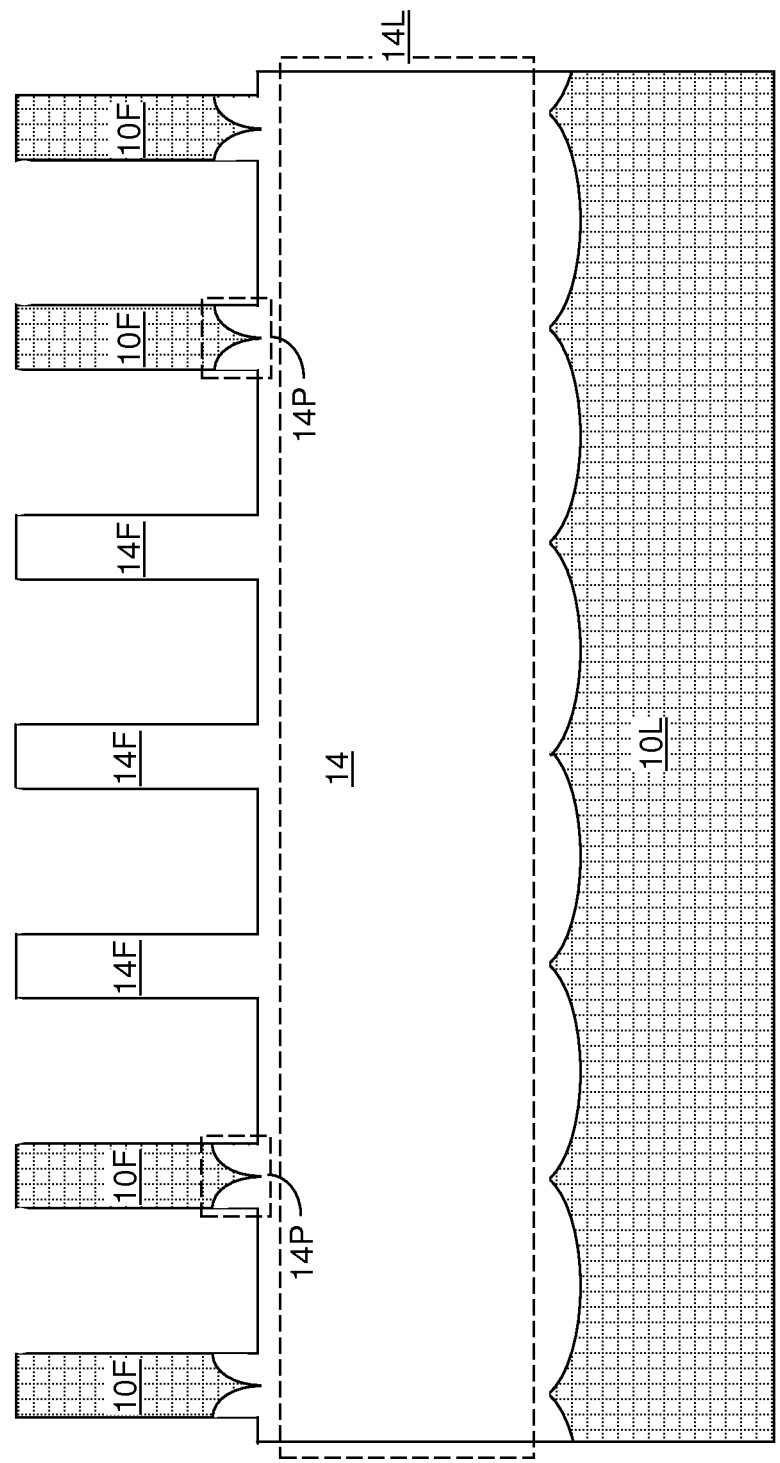
FIG. 8 is a vertical cross-sectional view of the first exemplary semiconductor structure after removing the oxygen-impermeable caps and the oxygen-impermeable spacers according to the first embodiment of the present disclosure.

Referring to FIG. 8, the oxygen-impermeable caps 58 and the oxygen-impermeable spacers 56 are removed selective to the semiconductor fins 10F, the semiconductor oxide fins 14F, the semiconductor oxide pedestal portions 14P, and the semiconductor oxide layer 14L. In one embodiment, the oxygen-impermeable caps 58 and the oxygen-impermeable spacers 56 can include silicon nitride, and the semiconductor oxide fins 14F, the semiconductor oxide pedestal portions 14P, and the semiconductor oxide layer 14L can include silicon oxide. In this case, a wet etch employing hot phosphoric acid can be employed to remove the oxygen-impermeable caps 58 and the oxygen-impermeable spacers 56 selective to the semiconductor oxide fins 14F, the semiconductor oxide pedestal portions 14P, and the semiconductor oxide layer 14L.

Figure 9:
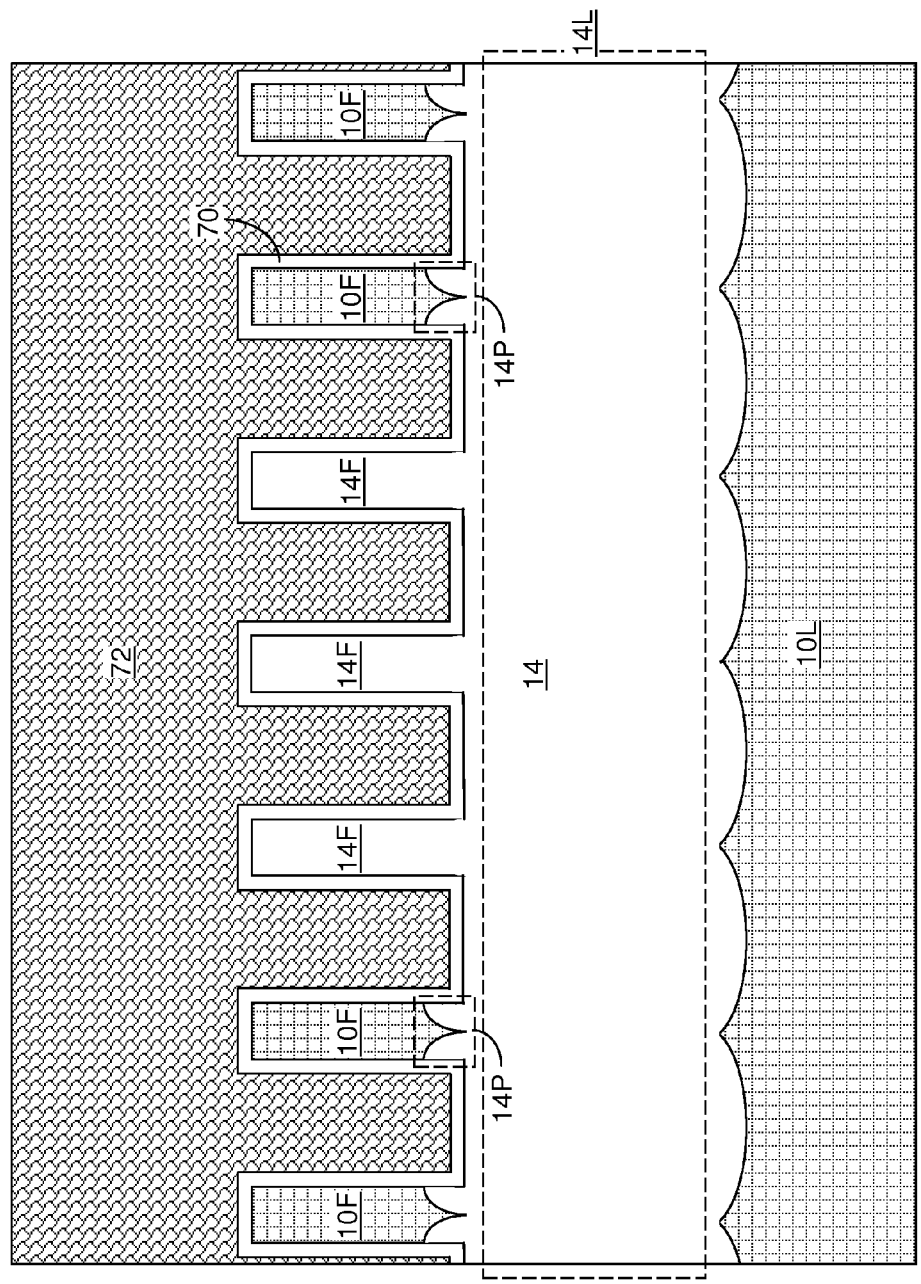
FIG. 9 is a vertical cross-sectional view of the first exemplary semiconductor structure after formation of a gate dielectric layer and a gate conductor layer according to the first embodiment of the present disclosure.

Referring to FIG. 9, a gate dielectric layer 70 and a gate conductor layer 72 can be deposited as contiguous layers over the entirety of the semiconductor fins 10F, the semiconductor oxide fins 14F, and the semiconductor oxide layer 14L. Each semiconductor fin 10F is a remaining portion of a semiconductor pedestal 10P. The gate dielectric layer 70 can include any permanent or disposable gate dielectric material known in the art. The gate conductor layer 72 can include any permanent or disposable gate conductor material known in the art.

The first exemplary semiconductor structure includes a semiconductor oxide layer 14L located on a semiconductor material layer 10L. A semiconductor oxide fin 10F protrudes above a planar surface of the semiconductor oxide layer 14L. A semiconductor oxide pedestal 14P (e.g., any of the illustrated semiconductor oxide pedestal 14P) protrudes above the planar surface of the semiconductor oxide layer 14L. A semiconductor fin 10F (e.g., any of the illustrated semiconductor fins 10F) contacts, and is located above, the semiconductor oxide pedestal 14P. A topmost surface of the semiconductor oxide fin 10F is located above the topmost portion of the semiconductor oxide pedestal 14P.

The gate dielectric layer 70 contacts the planar top surface of the semiconductor oxide layer 14L, surfaces of the semiconductor oxide fin 14F, surfaces of the semiconductor oxide pedestal 14P, and surfaces of the semiconductor fin 10F. A gate conductor layer 72 contacts surfaces of the gate dielectric layer 70.

In one embodiment, each semiconductor fin 10F can include a pair of convex surfaces that contact surfaces of an underlying semiconductor oxide pedestal 14P because of the oxidation process that converts the semiconductor pedestals 10P can proceed isotropically. In another embodiment, the pair of convex surfaces can be adjoined at an edge that is parallel to a pair of vertical sidewalls of the semiconductor fin 10F.

In one embodiment, the topmost surface of the semiconductor oxide fin 14F can be coplanar with a topmost surface of a semiconductor fin 10F. In another embodiment, the sidewalls of a semiconductor oxide fin 10F can be vertically coincident with sidewalls of an underlying semiconductor oxide pedestal 14P due to the anisotropic etch process that forms the trench 21. (See FIG. 7.)

In one embodiment, a portion of the interface between the semiconductor oxide layer 14L and the semiconductor material layer 10L can protrude downward in regions that do not underlie the semiconductor fin 10F or the semiconductor oxide fin 14F with respect to another portion of the interface in regions that underlie the semiconductor fin 10F or the semiconductor oxide fin 14F. In another embodiment, convex surfaces of the semiconductor oxide layer 14L can contact concave surfaces of the semiconductor material layer 10L at the interface. The non-uniform height of the interface is caused by the non-uniform areal distribution of the bottom surfaces of the oxygen-permeable portion 12 (See FIG. 5), which is the location from which oxidation of the semiconductor material layer 10L commences during the oxidation process illustrated in FIG. 6.

The semiconductor oxide fins 14F are present in regions between the semiconductor fins (10S, 10D, 10B) as dummy structures that prevent local depression of the top surface of the gate conductor layer 72. Thus, the presence of the semiconductor oxide fins 14F decreases topographical variations in the height of the top surface of the gate conductor layer 72.

Figure 10:
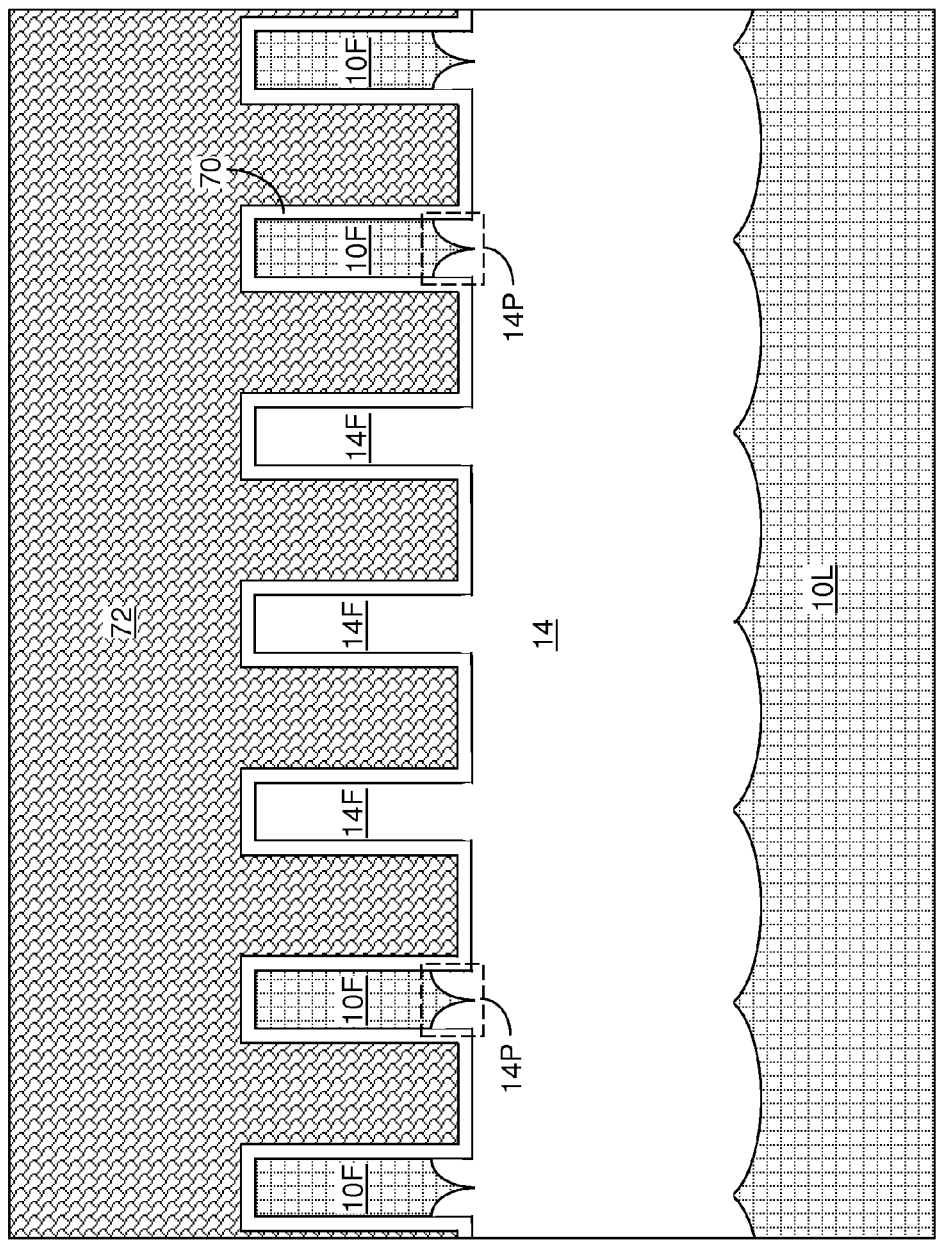
FIG. 10 is a vertical cross-sectional view of the first exemplary semiconductor structure after patterning of the gate conductor layer and the gate dielectric layer into a gate electrode and a gate dielectric, respectively, according to the first embodiment of the present disclosure.
Figure 10A:
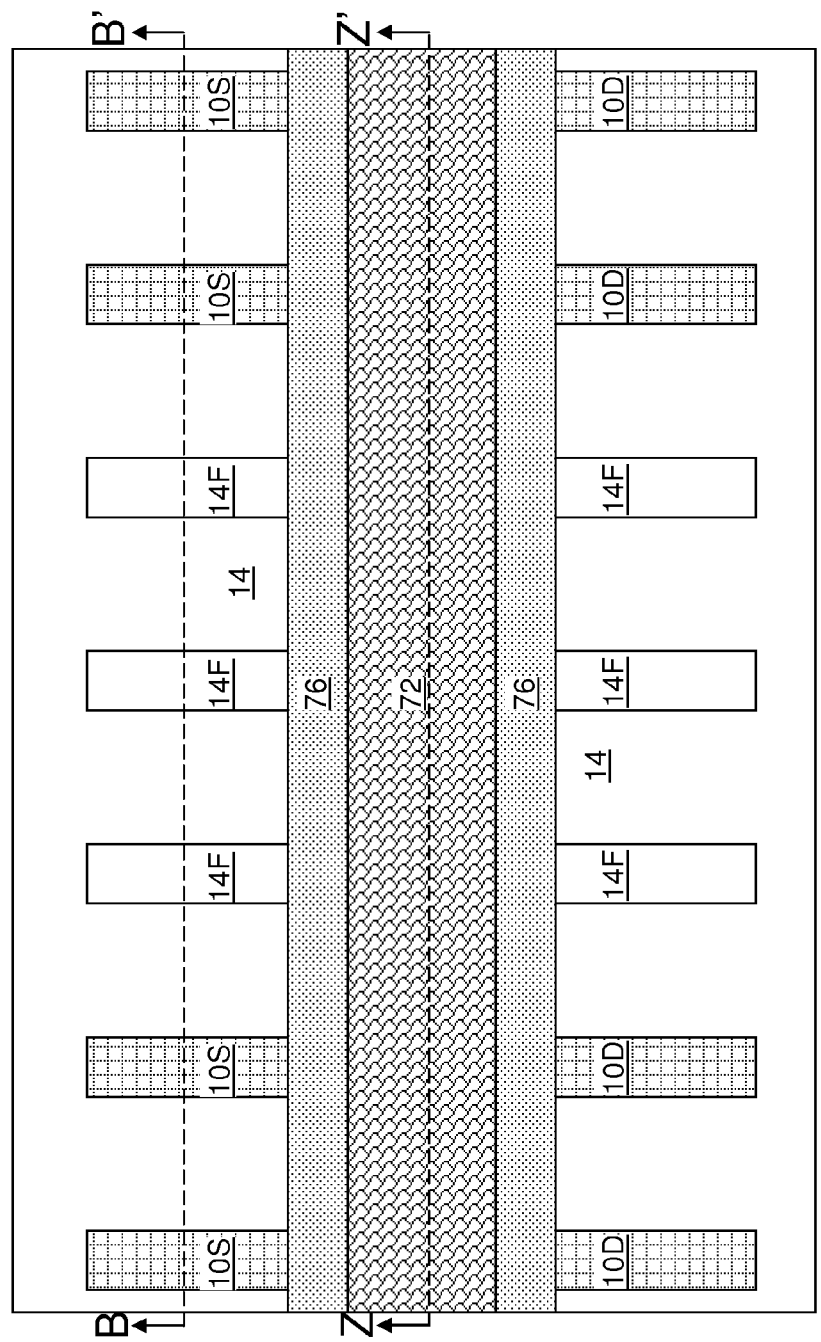
FIG. 10A is a top-down view of the first exemplary semiconductor structure of FIG. 10 in which a planarization dielectric layer is not shown for illustrative purposes. The vertical plane Z-Z' represents the plane of the vertical cross-sectional view of FIG. 10.
Figure 10B:
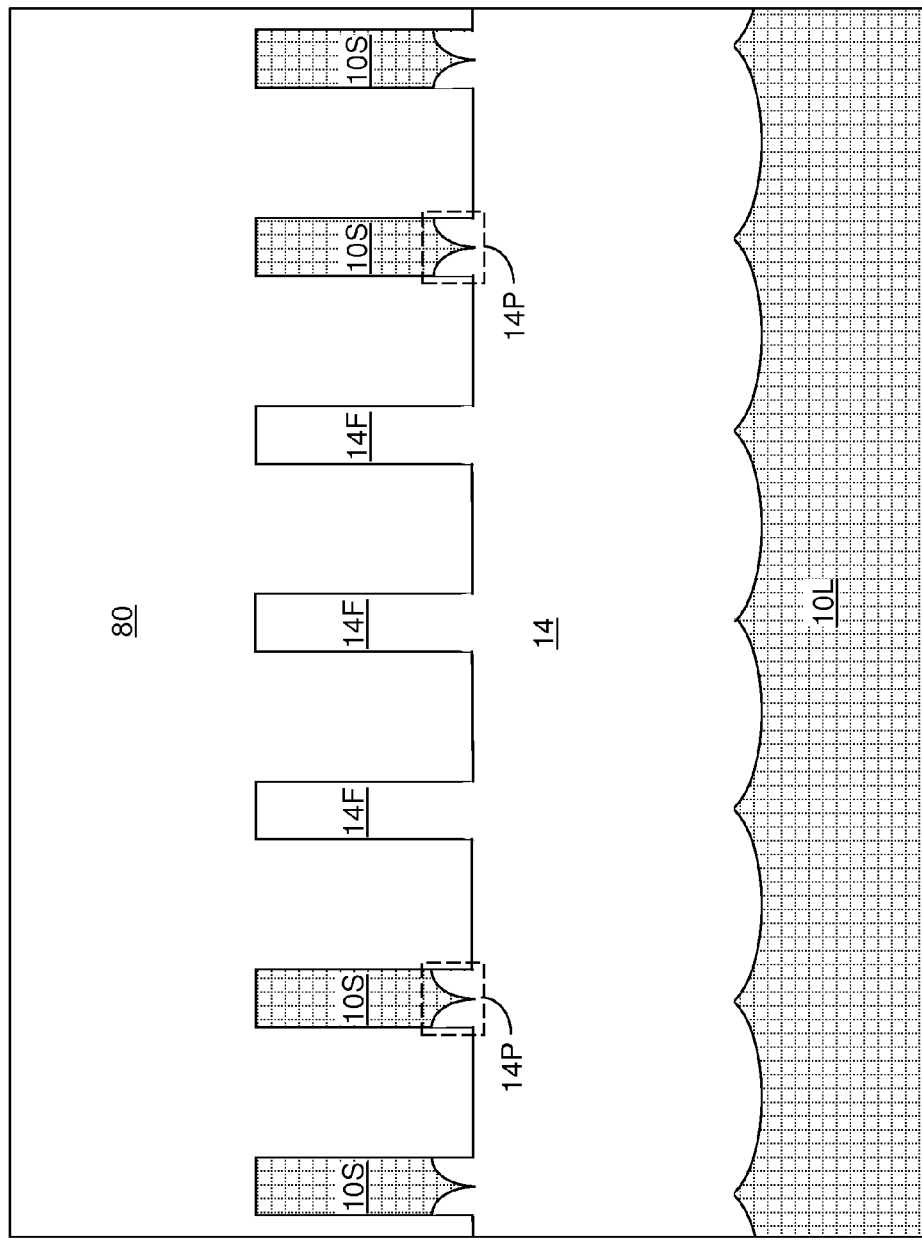
FIG. 10B is a vertical cross-sectional view of the first exemplary semiconductor structure of FIGS. 10 and 10A along the vertical plane B-B' in FIG. 10A.

Referring to FIGS. 10, 10A, and 10B, the gate conductor layer 72 and the gate dielectric layer 70 can be patterned employing methods known in the art. The remaining portion of the gate conductor layer 72 can be a gate electrode, and a remaining portion of the gate dielectric layer 70 can be a gate dielectric for a field effect transistor.

A gate spacer 76 can be formed on the sidewalls of the stack of the gate dielectric and the gate electrode, for example, by deposition of a conformal dielectric material layer and an anisotropic etch that removes horizontal portions of the conformal dielectric material layer. The remaining vertical portion of the conformal dielectric material layer is the gate spacer 76.

Electrical dopants can be implanted into physically exposed portions of the semiconductor fins 10F to form source regions 10S and drain regions 10D prior to, and/or after, formation of the gate spacer 76. Unimplanted portions of the semiconductor fins 10F are herein referred to as a body region 10B. The semiconductor oxide fins 14F are of integral construction (i.e., in a same contiguous structure) as the semiconductor oxide layer 14L, and does not contact any semiconductor material. The semiconductor oxide pedestals 14P are of integral construction as the semiconductor oxide layer 14L.

A gate level dielectric layer 80 can be deposited over the semiconductor fins (10S, 10D, 10B), the semiconductor oxide fins 14F, and a gate stack (70, 72), and can be optionally planarized so that the top surface of the gate level dielectric layer 80 is coplanar with the top surface of the gate electrode. Various contact via structures (not shown) can be formed through the gate level dielectric layer 80 as needed.

Because the presence of the semiconductor oxide fins 14F prevents local depression of the top surface of the gate conductor layer 72, the topographical variations in the height of the top surface of the gate level dielectric layer 80 is reduced due to the presence of the semiconductor oxide fins 14F. The reduction in the topographical variations in the height of the top surface of the gate level dielectric layer 80 has the advantage of reducing topographical variations in the height of various metal interconnect level structures such as metal lines and metal vias, and thus, facilitates the processing steps employed to form metal interconnect structures.

Figure 11A:
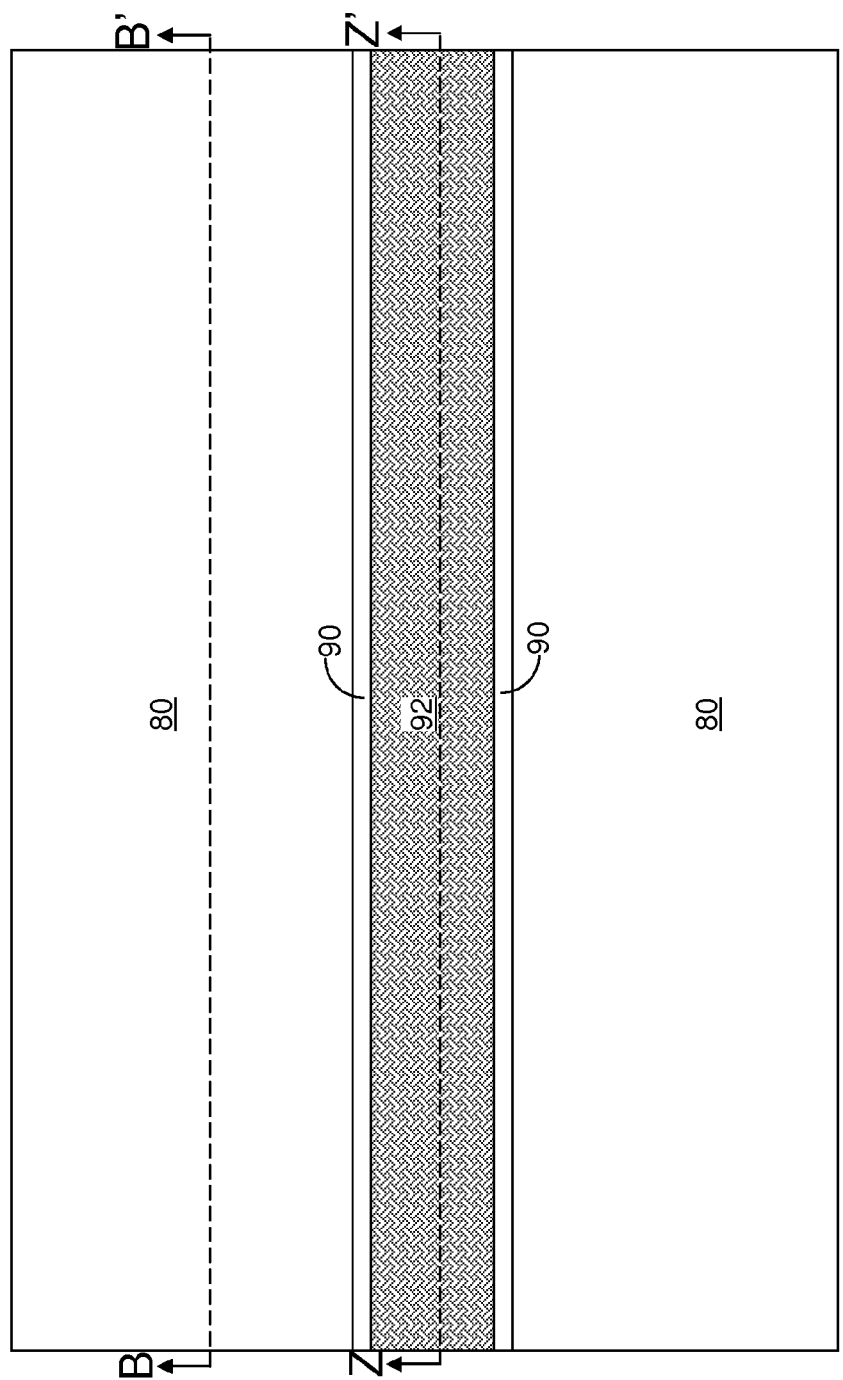
FIG. 11A is a top-down view of the variation of the first exemplary semiconductor structure of FIG. 11 in which a planarization dielectric layer is not shown for illustrative purposes. The vertical plane Z-Z' represents the plane of the vertical cross-sectional view of FIG. 11.
Figure 11B:
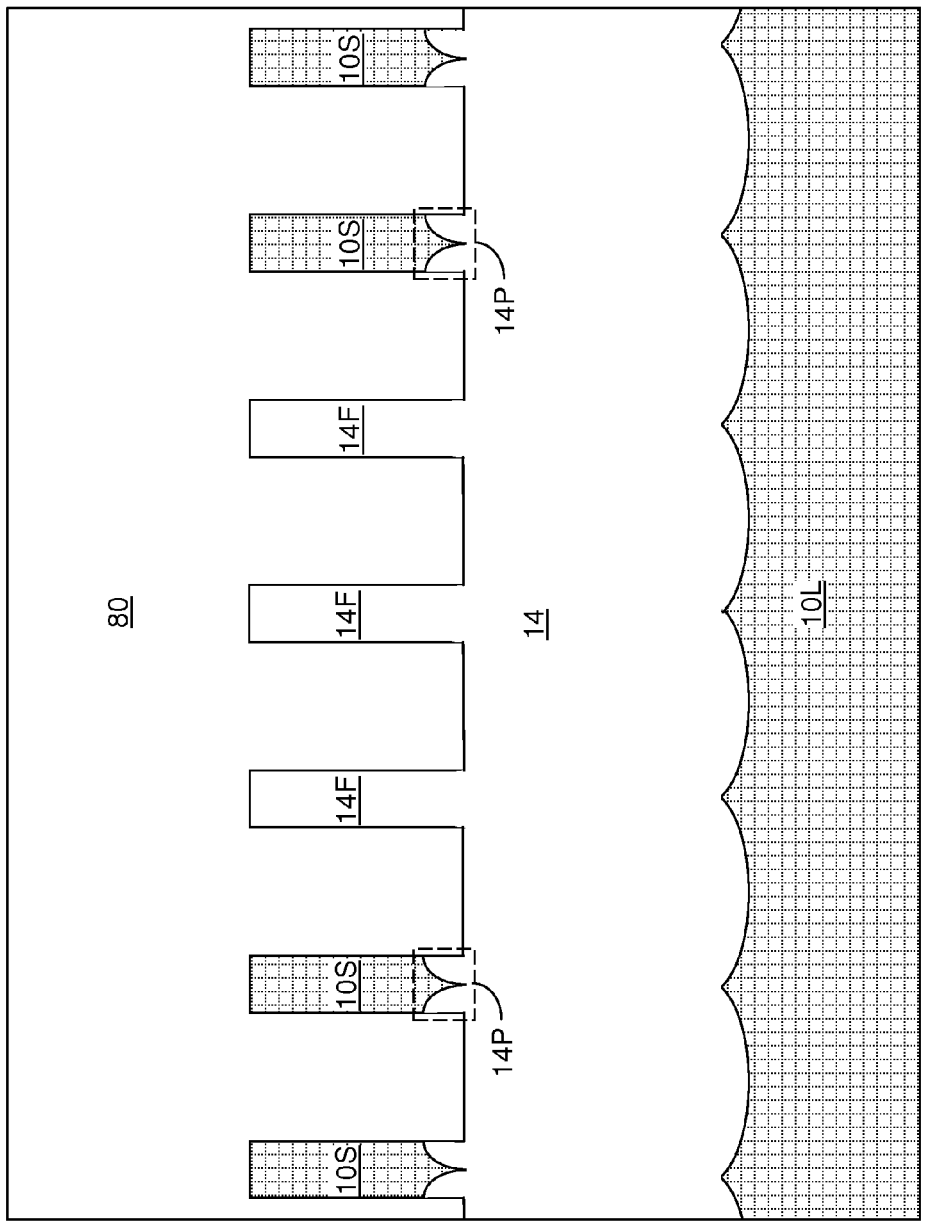
FIG. 11B is a vertical cross-sectional view of the first exemplary semiconductor structure of FIGS. 11 and 11A along the vertical plane B-B' in FIG. 11A.

Referring to FIGS. 11, 11A, and 11B, a variation of the first exemplary semiconductor structure is illustrated, which can be formed by employing a replacement gate integration scheme. For example, the gate dielectric layer 70 and the gate conductor layer 72 can be replaced with disposable gate materials such as a silicon-germanium alloy, an amorphous carbon material, a porous or non-porous organosilicate glass, any other disposable dielectric material, or a combination thereof. After formation and planarization of the gate level dielectric layer 80, the disposable gate materials are removed selective to the gate spacer 76, the semiconductor fins (10S, 10D, 10B), and the gate level dielectric layer 80 to form a gate cavity. The gate cavity is filled with a gate dielectric 90 and a gate electrode 92, which are herein referred to as a replacement gate dielectric and a replacement gate electrode, respectively.

Figure 12:
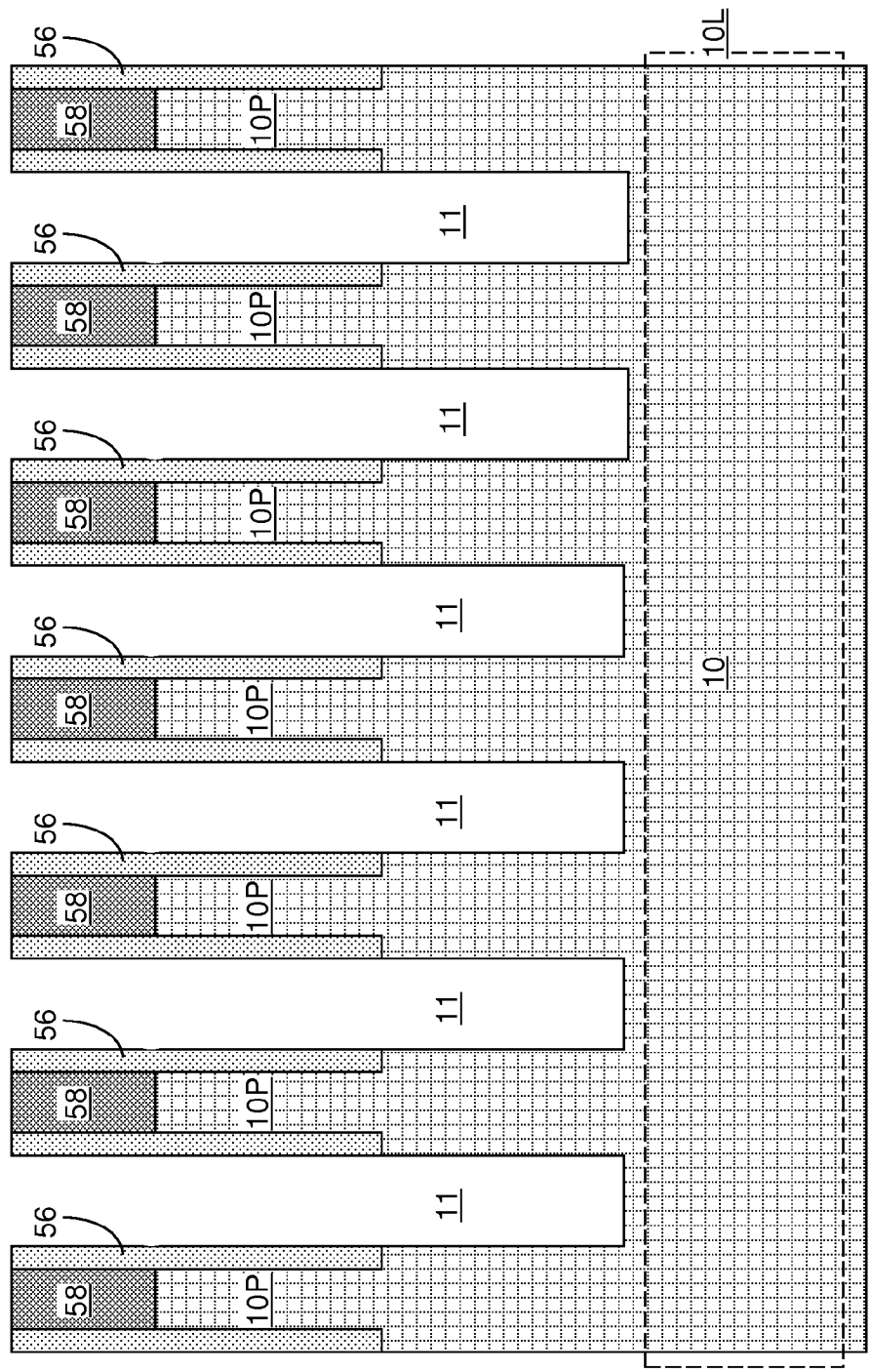
FIG. 12 is a vertical cross-sectional view of a second exemplary semiconductor structure after recessing a top surface of a semiconductor material layer according to a second embodiment of the present disclosure.

Referring to FIG. 12, a second exemplary semiconductor structure according to a second embodiment of the present disclosure can be derived from the first exemplary semiconductor structure of FIG. 2 by performing the anisotropic etch process of FIG. 4 without forming any masking layer. Physically exposed surfaces of the semiconductor material layer 10L is recessed by an anisotropic etch, i.e., the bottom surface of the cavity 11 is recessed by the anisotropic etch. The anisotropic etch employs the combination of the oxygen-impermeable caps 58 and the oxygen-impermeable spacers 56 as an etch mask. Each semiconductor pedestal 10P is vertically extended by the anisotropic etch as the trench 11, and is extended downward by the anisotropic etch. Thus, the height of each of the first semiconductor pedestals and the height of the second semiconductor pedestal increase by the recessing. The increase in the height can, for example, in a range from 10 nm to 1,000 nm, although lesser and greater height increases can also be employed.

Each semiconductor pedestal 10P includes a lower portion having sidewalls that are vertically coincident with outer sidewalls of an oxygen-impermeable spacer 56 and an upper portion that contacts inner sidewalls of the oxygen-impermeable spacer 56. Each protruding structure includes a semiconductor pedestal 10P, an oxygen-impermeable cap 58, and an oxygen-impermeable spacer 56. Each protruding structure includes a semiconductor pedestal 10A of integral construction with the semiconductor material layer 10L.

Figure 13:
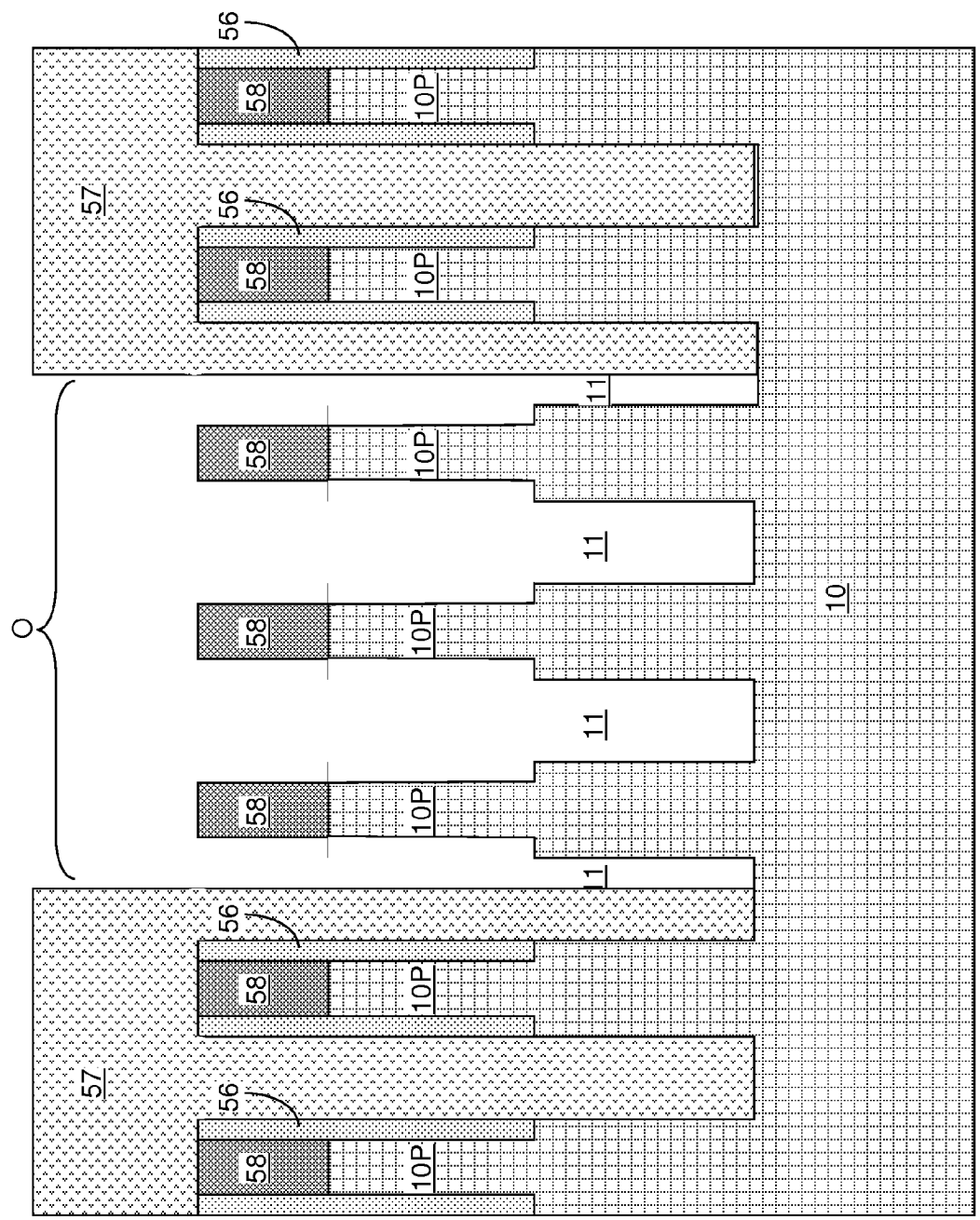
FIG. 13 is a vertical cross-sectional view of the second exemplary semiconductor structure after application and patterning of a masking layer and removal of physically exposed oxygen-impermeable spacers according to the second embodiment of the present disclosure.

Referring to FIG. 13, a masking layer 57 is applied over the vertical stacks of the semiconductor pedestals 10P and the oxygen-impermeable caps 58, and is patterned to form at least one opening O therein. In one embodiment, the masking layer 57 can be a photoresist layer that can be patterned lithographically. The edges of the patterned masking layer 57 can be located between neighboring pairs of oxygen-impermeable spacers 56, each laterally surrounding a vertical stack of a semiconductor pedestal 10P and an oxygen-impermeable cap 58. In other words, the edges of the patterned masking layer 57 can contact the planar bottom surface of the trench 11.

The oxygen-impermeable spacers 56 located underneath the masking layer 57 are herein referred to as first oxygen-impermeable spacers. The oxygen-impermeable spacers 56 located within the at least one opening O are herein referred to as second oxygen-impermeable spacers 56. The semiconductor pedestals 10P located underneath the masking layer 57 are herein referred to as first semiconductor pedestals 10P. The semiconductor pedestals 10P located within the area of the at least one opening O are herein referred to as second semiconductor pedestals. The oxygen-impermeable spacers 56 located underneath the masking layer 57 are herein referred to as first oxygen-impermeable spacers. The oxygen-impermeable spacers 56 located within the at least one opening O are herein referred to as second oxygen-impermeable spacers.

Physically exposed oxygen-impermeable spacers 56, i.e., the second oxygen-impermeable spacers, within the at least one opening O are removed selective to the semiconductor material of the semiconductor pedestals 10P while the first oxygen-impermeable spacers remain on the first semiconductor pedestal. The masking layer 57 can be subsequently removed, for example, by ashing. The second oxygen-impermeable spacers are removed while the first oxygen-impermeable spacers remain on the first semiconductor pedestals.

Figure 14:
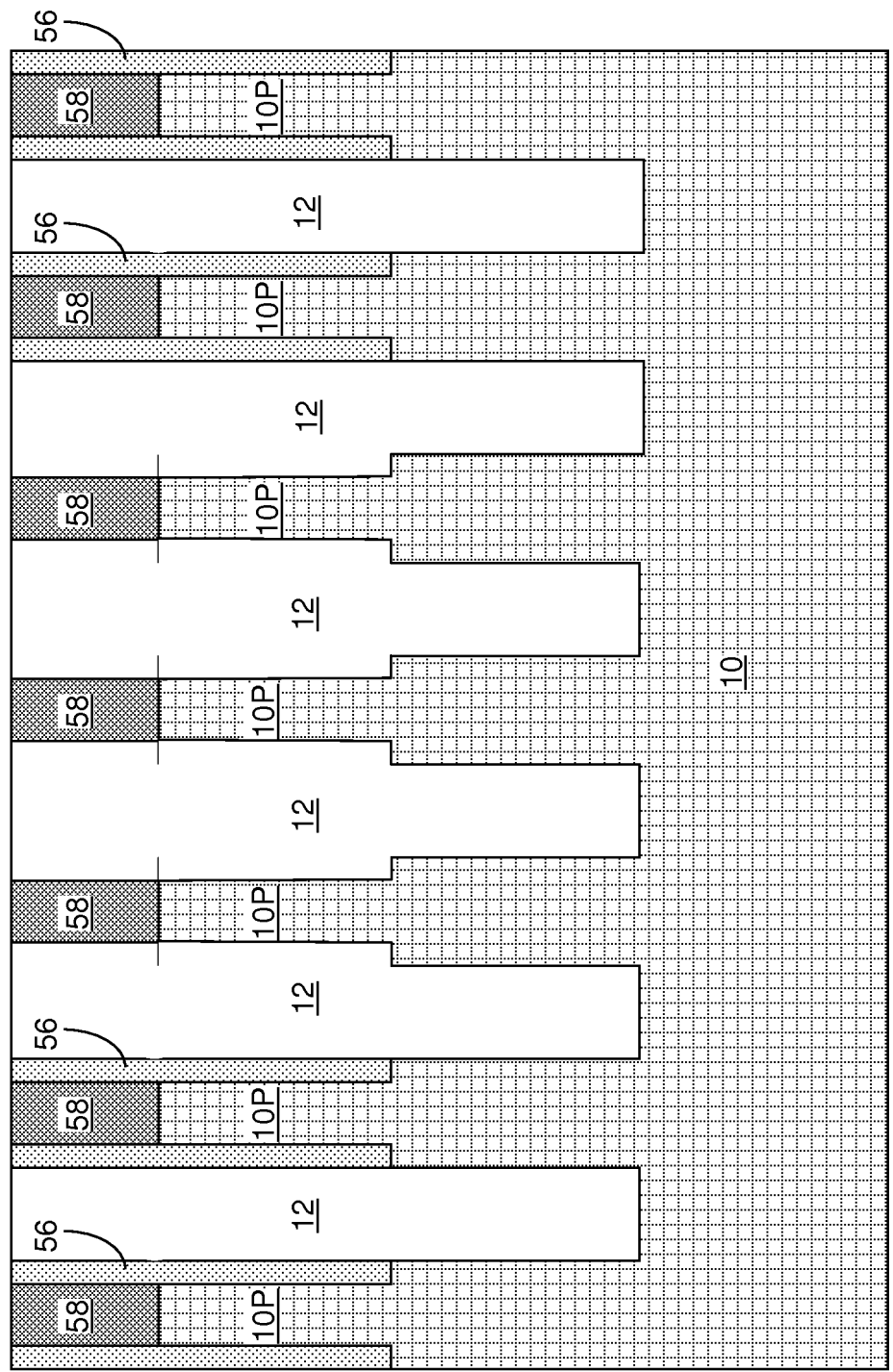
FIG. 14 is a vertical cross-sectional view of the second exemplary semiconductor structure after filling the trench with an oxygen-permeable material according to the second embodiment of the present disclosure.

Referring to FIG. 14, the trench 11 is filled with an oxygen-permeable material to form an oxygen-permeable portion 12. In one embodiment, the oxygen-permeable material can be silicon oxide deposited by chemical vapor deposition. The deposited oxygen-permeable material is planarized, for example, by chemical mechanical planarization employing top surfaces of the oxygen-impermeable caps 58. The top surface of the oxygen-permeable portion 12 can be coplanar with the top surfaces of the oxygen-impermeable caps 58.

The processing steps of FIGS. 6, 7, 8, 9, 10, 10A, 10B, and optionally the processing steps of FIGS. 11, 11A, and 11B can be performed to provide a structure illustrated in FIGS. 10, 10A, and 10B or a structure illustrated in FIGS. 11, 11A, and 11B.

Figure 15:
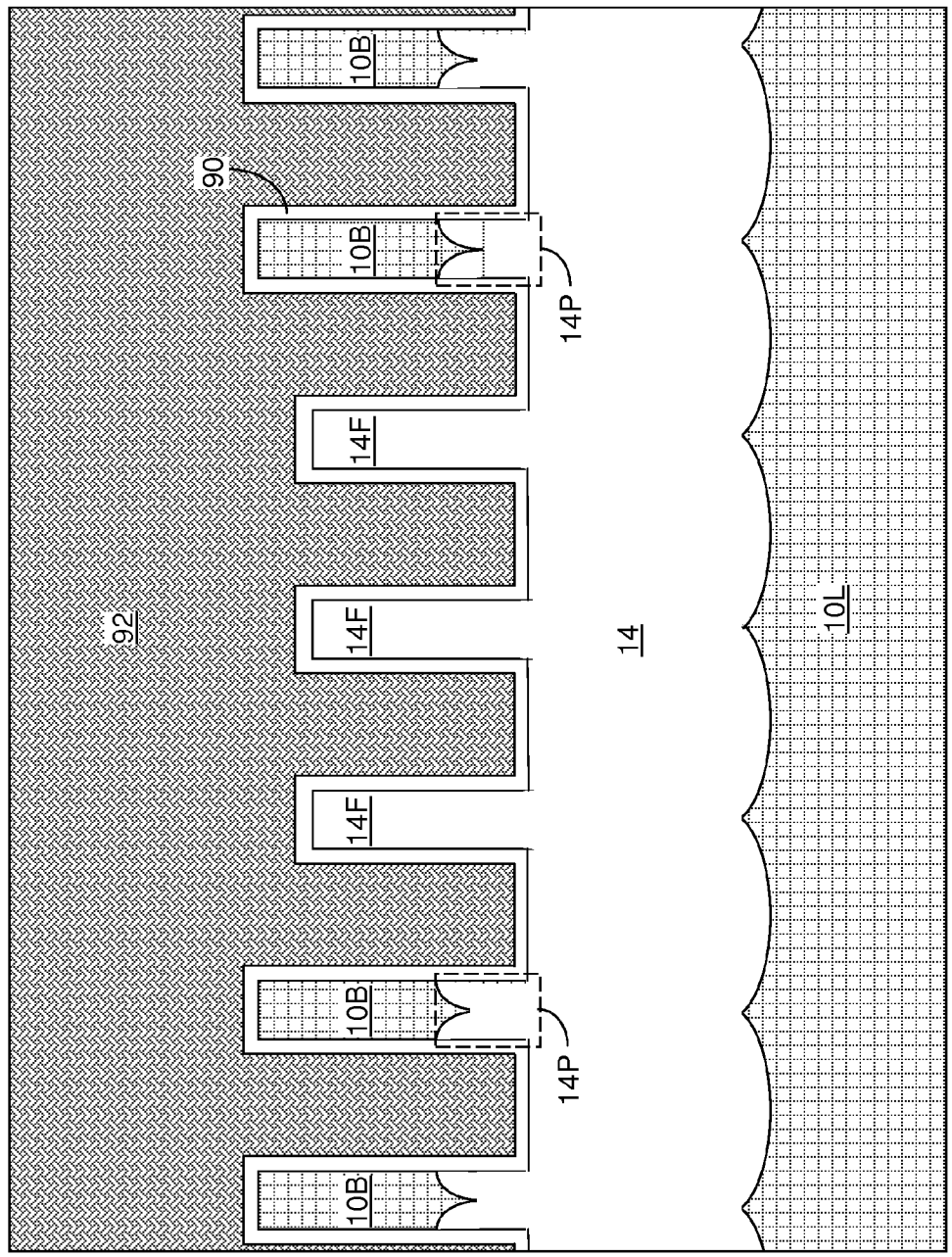
FIG. 15 is a vertical cross-sectional view of a third exemplary semiconductor structure according to a third embodiment of the present disclosure.

Referring to FIG. 15, a third exemplary semiconductor structure can be derived from the first exemplary semiconductor structure of FIG. 8, or by the second exemplary semiconductor structure as provided at the processing step of FIG. 8, by recessing the semiconductor oxide fins 14F employing an anisotropic etch. The planar top surface of the semiconductor oxide layer 14L may be vertically recessed during the anisotropic etch. In this case, the height of the semiconductor oxide pedestals 14P can increase due to the anisotropic etch. The topmost surfaces of the semiconductor oxide fins 14F can be located below the horizontal plane including the topmost surface of the semiconductor fins (10S, 10D, 10B).

The third exemplary semiconductor structure has the advantage of increasing the conductivity of the gate conductor layer 92 (or a gate conductor layer 70; See FIGS. 10, 10A, and 10B) at the expense of increasing the topographical variations in the height of the top surface of the gate conductor layer 92 (or the gate conductor layer 70) and/or in the height of the gate level dielectric layer 80.

Figure 16:
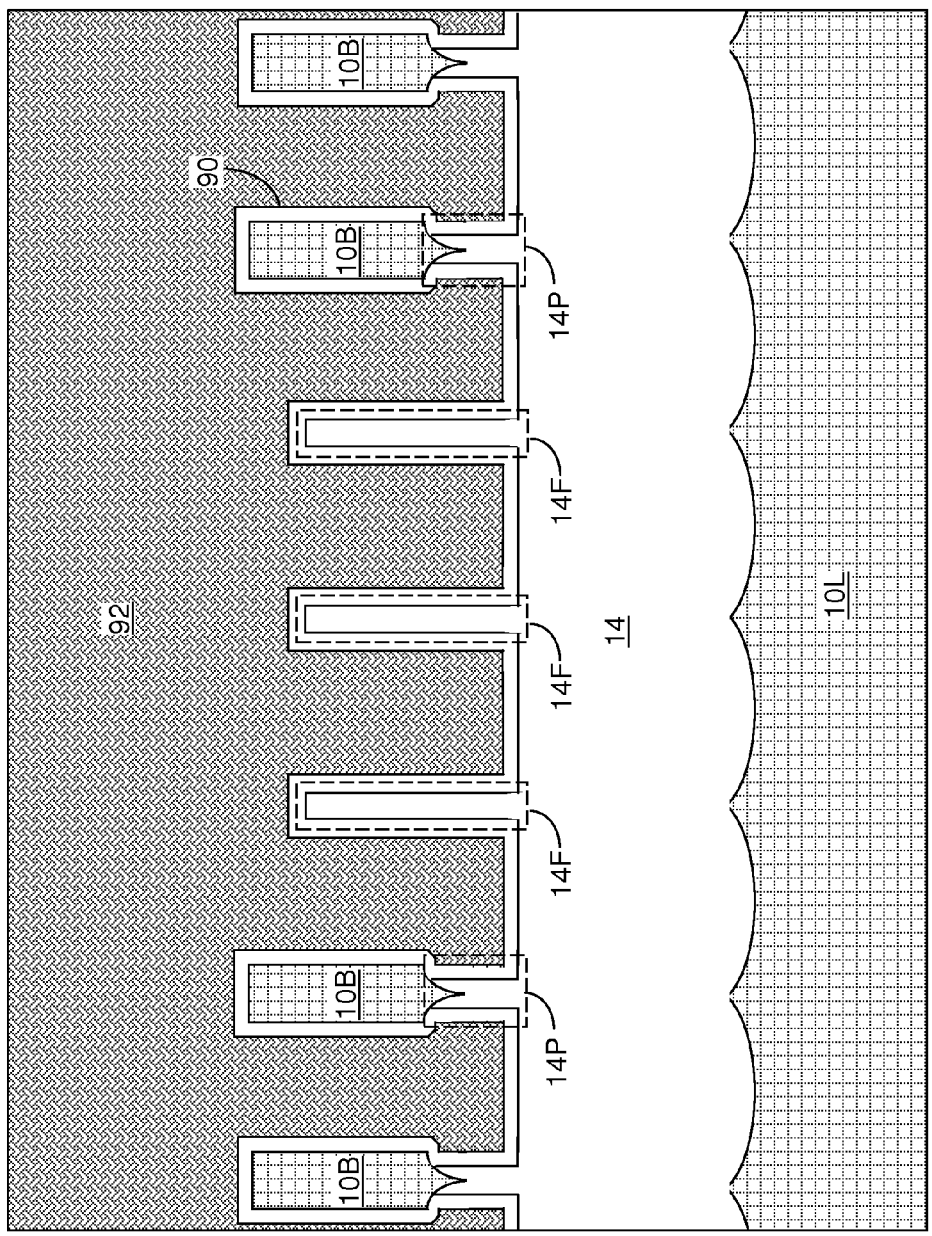
FIG. 16 is vertical cross-sectional view of a fourth exemplary semiconductor structure according to a fourth embodiment of the present disclosure.

Referring to FIG. 16, a third exemplary semiconductor structure can be derived from the first exemplary semiconductor structure of FIG. 8, or by the second exemplary semiconductor structure as provided at the processing step of FIG. 8, by recessing the semiconductor oxide fins 14F employing an etch process, which can be an isotropic etch or a combination of an isotropic etch and an anisotropic etch. The height and the width of each semiconductor oxide fin 14F can decrease by the etch process. The planar top surface of the semiconductor oxide layer 14L may be vertically recessed during the anisotropic etch. The sidewalls of the semiconductor oxide fins 14F can be laterally recessed inward with respect to sidewalls of the overlying semiconductor fins (10S, 10D, 10B). In this case, the etch process can increase the height of the semiconductor oxide pedestals 14P, and decrease the width of the semiconductor oxide pedestals 14P. The topmost surfaces of the semiconductor oxide fins 14F can be located below the horizontal plane including the topmost surface of the semiconductor fins (10S, 10D, 10B).

The fourth exemplary semiconductor structure has the advantage of increasing the conductivity of the gate conductor layer 92 (or a gate conductor layer 70; See FIGS. 10, 10A, and 10B) at the expense of increasing the topographical variations in the height of the top surface of the gate conductor layer 92 (or the gate conductor layer 70) and/or in the height of the gate level dielectric layer 80.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
  a semiconductor oxide layer located on a semiconductor material layer;
  a semiconductor oxide fin that protrudes above a planar surface of said semiconductor oxide layer;
  a semiconductor oxide pedestal that protrudes above said planar surface of said semiconductor oxide layer and laterally spaced from said semiconductor oxide fin; and
  a semiconductor fin contacting, and located above, said semiconductor oxide pedestal, wherein a topmost surface of said semiconductor oxide fin is located above a topmost portion of said semiconductor oxide pedestal, and sidewalls of said semiconductor oxide fin are vertically coincident with sidewalls of said semiconductor oxide pedestal.

2. The semiconductor structure of claim 1, further comprising a gate dielectric layer contacting said planar top surface of said semiconductor oxide layer, surfaces of said semiconductor oxide fin, surfaces of said semiconductor oxide pedestal, and surfaces of said semiconductor fin.

3. The semiconductor structure of claim 2, further comprising a gate conductor layer contacting surfaces of said gate dielectric layer.

4. The semiconductor structure of claim 1, wherein said semiconductor fin comprises a pair of convex surfaces that contact surfaces of said semiconductor oxide pedestal.

5. The semiconductor structure of claim 4, wherein said pair of convex surfaces is adjoined at an edge that is parallel to a pair of vertical sidewalls of said semiconductor fin.

6. The semiconductor structure of claim 1, wherein said topmost surface of said semiconductor oxide fin is coplanar with a topmost surface of said semiconductor fin.

7. The semiconductor structure of claim 1, wherein said topmost surface of said semiconductor oxide fin is located below a horizontal plane including a topmost surface of said semiconductor fin.

8. A semiconductor structure comprising:
  a semiconductor oxide layer located on a semiconductor material layer;
  a semiconductor oxide fin that protrudes above a planar surface of said semiconductor oxide layer;
  a semiconductor oxide pedestal that protrudes above said planar surface of said semiconductor oxide layer and laterally spaced from said semiconductor oxide fin; and
  a semiconductor fin contacting, and located above, said semiconductor oxide pedestal, wherein a topmost surface of said semiconductor oxide fin is located above a topmost portion of said semiconductor oxide pedestal, wherein sidewalls of said semiconductor oxide fin are laterally recessed inward with respect to sidewalls of said semiconductor fin.

9. The semiconductor structure of claim 8, further comprising a gate dielectric layer contacting said planar top surface of said semiconductor oxide layer, surfaces of said semiconductor oxide fin, surfaces of said semiconductor oxide pedestal, and surfaces of said semiconductor fin.

10. The semiconductor structure of claim 9, wherein said semiconductor fin comprises a pair of convex surfaces that contact surfaces of said semiconductor oxide pedestal.

11. The semiconductor structure of claim 10, wherein said pair of convex surfaces is adjoined at an edge that is parallel to a pair of vertical sidewalls of said semiconductor fin.

12. The semiconductor structure of claim 8, wherein said topmost surface of said semiconductor oxide fin is coplanar with a topmost surface of said semiconductor fin.

13. The semiconductor structure of claim 8, wherein said topmost surface of said semiconductor oxide fin is located below a horizontal plane including a topmost surface of said semiconductor fin.

14. A semiconductor structure comprising:
  a semiconductor oxide layer located on a semiconductor material layer;
  a semiconductor oxide fin that protrudes above a planar surface of said semiconductor oxide layer;
  a semiconductor oxide pedestal that protrudes above said planar surface of said semiconductor oxide layer and laterally spaced from said semiconductor oxide fin; and
  a semiconductor fin contacting, and located above, said semiconductor oxide pedestal, wherein a topmost surface of said semiconductor oxide fin is located above a topmost portion of said semiconductor oxide pedestal, wherein a portion of an interface between said semiconductor oxide layer and said semiconductor material layer protrudes downward in regions that do not underlie said semiconductor fin or said semiconductor oxide fin with respect to another portion of said interface in regions that underlie said semiconductor fin or said semiconductor oxide fin.

15. The semiconductor structure of claim 14, further comprising a gate dielectric layer contacting said planar top surface of said semiconductor oxide layer, surfaces of said semiconductor oxide fin, surfaces of said semiconductor oxide pedestal, and surfaces of said semiconductor fin.

16. The semiconductor structure of claim 14, wherein said semiconductor fin comprises a pair of convex surfaces that contact surfaces of said semiconductor oxide pedestal.

17. The semiconductor structure of claim 16, wherein said pair of convex surfaces is adjoined at an edge that is parallel to a pair of vertical sidewalls of said semiconductor fin.

18. The semiconductor structure of claim 14, wherein sidewalls of said semiconductor oxide fin are vertically coincident with sidewalls of said semiconductor oxide pedestal.

19. The semiconductor structure of claim 14, wherein said topmost surface of said semiconductor oxide fin is located below a horizontal plane including a topmost surface of said semiconductor fin.

20. The semiconductor structure of claim 14, wherein sidewalls of said semiconductor oxide fin are laterally recessed inward with respect to sidewalls of said semiconductor fin.

* * * * *